(12) United States Patent
Bolken

(10) Patent No.: US 6,538,311 B2
(45) Date of Patent: Mar. 25, 2003

(54) TWO-STAGE TRANSFER MOLDING METHOD TO ENCAPSULATE MMC MODULE

(75) Inventor: Todd O. Bolken, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/092,216

(22) Filed: Mar. 5, 2002

(65) Prior Publication Data

US 2002/0187584 A1 Dec. 12, 2002

Related U.S. Application Data

(62) Division of application No. 09/879,171, filed on Jun. 12, 2001, now Pat. No. 6,444,501.

(51) Int. Cl.[7] ................................................. H01L 23/02
(52) U.S. Cl. .................. 257/679; 257/687; 257/787; 257/790; 257/793
(58) Field of Search ................................. 257/679, 687, 257/787, 790, 793

(56) References Cited

U.S. PATENT DOCUMENTS

| | | |
|---|---|---|
| 4,305,897 A | 12/1981 | Hazama et al. |
| 4,554,126 A | 11/1985 | Sera |
| 4,701,999 A | 10/1987 | Palmer |
| 4,769,344 A | 9/1988 | Sakai et al. |
| 4,779,835 A | 10/1988 | Fukushima et al. |
| 4,784,872 A | 11/1988 | Moeller et al. |
| 4,818,204 A | 4/1989 | Nakagawa et al. |
| 4,862,245 A | 8/1989 | Pashby et al. |
| 4,900,485 A | 2/1990 | Murakami |
| 4,908,178 A | 3/1990 | Nakagawa et al. |
| 4,984,059 A | 1/1991 | Kubota et al. |
| 5,071,334 A | 12/1991 | Ohara |
| 5,074,779 A | 12/1991 | Tsutsumi et al. |
| 5,108,955 A | 4/1992 | Ishida et al. |
| 5,184,208 A | 2/1993 | Sakuta et al. |
| 5,218,759 A | 6/1993 | Juskey et al. |
| 5,252,853 A | 10/1993 | Michii |
| 5,286,679 A | 2/1994 | Farnworth et al. |
| 5,304,842 A | 4/1994 | Farnworth et al. |
| 5,318,677 A | 6/1994 | Hirbour et al. |
| 5,344,795 A | 9/1994 | Hashemi et al. |
| 5,366,933 A | 11/1994 | Golwalker et al. |
| 5,367,196 A | 11/1994 | Mahulikar et al. |
| 5,369,056 A | 11/1994 | Burns et al. |
| 5,436,203 A | 7/1995 | Lin |
| 5,440,169 A | 8/1995 | Tomita et al. |

(List continued on next page.)

FOREIGN PATENT DOCUMENTS

| | | |
|---|---|---|
| JP | 55-128835 | 10/1980 |
| JP | 56-133857 | 10/1981 |
| JP | 56-4241 | 1/1987 |
| JP | 62-109326 | 5/1987 |
| JP | 62-115834 | 5/1987 |
| JP | 62-261133 | 11/1987 |
| JP | 2-306639 | 12/1990 |

Primary Examiner—Kamand Cuneo
Assistant Examiner—David A. Zarneke
(74) Attorney, Agent, or Firm—TraskBritt

(57) ABSTRACT

A semiconductor card includes a printed circuit substrate upon which is mounted a card circuit including one or more semiconductor components such as dice or packages. External contacts link the card circuit to the circuit of another apparatus by removable insertion therein. The substrate is defined by a peripheral opening in a surrounding frame, which may be part of a multiframe strip. The substrate is connected to the frame by connecting segments. The card includes a first plastic casting molded to the substrate and encapsulating the semiconductor components while leaving a peripheral portion of the substrate uncovered. A second plastic casting is molded to the peripheral portion to abut the first plastic casting and form the card periphery. A method for fabricating the semiconductor card is also included.

34 Claims, 16 Drawing Sheets

U.S. PATENT DOCUMENTS

| | | |
|---|---|---|
| 5,441,684 A | 8/1995 | Lee |
| 5,442,234 A | 8/1995 | Liang |
| 5,461,255 A | 10/1995 | Chan et al. |
| 5,470,892 A | 11/1995 | Gupta et al. |
| 5,471,366 A | 11/1995 | Ozawa |
| 5,530,295 A | 6/1996 | Mehr |
| 5,550,711 A | 8/1996 | Burns et al. |
| 5,592,735 A | 1/1997 | Ozawa et al. |
| 5,596,231 A | 1/1997 | Combs |
| 5,598,034 A | 1/1997 | Wakefield |
| 5,604,376 A | 2/1997 | Hamburgen et al. |
| 5,626,887 A | 5/1997 | Chou et al. |
| 5,652,461 A | 7/1997 | Ootsuki et al. |
| 5,675,182 A | 10/1997 | Moscicki |
| 5,693,984 A | 12/1997 | Ootsuki |
| 5,719,442 A | 2/1998 | Otsuki |
| 5,766,982 A | 6/1998 | Akram et al. |
| 5,793,118 A | 8/1998 | Nakajima |
| 5,796,160 A | 8/1998 | Kozono |
| 5,801,074 A | 9/1998 | Kim et al. |
| 5,807,768 A | 9/1998 | Shin |
| 5,891,759 A | 4/1999 | Otsuki |
| 5,986,336 A | 11/1999 | Tomita |
| 5,989,940 A | 11/1999 | Nakajima |
| 5,998,243 A | 12/1999 | Odashima et al. |
| 6,001,672 A | 12/1999 | Wensel |
| 6,002,173 A | 12/1999 | Casati et al. |
| 6,107,690 A | 8/2000 | Courtenay et al. |
| 6,252,308 B1 | 6/2001 | Akram et al. |

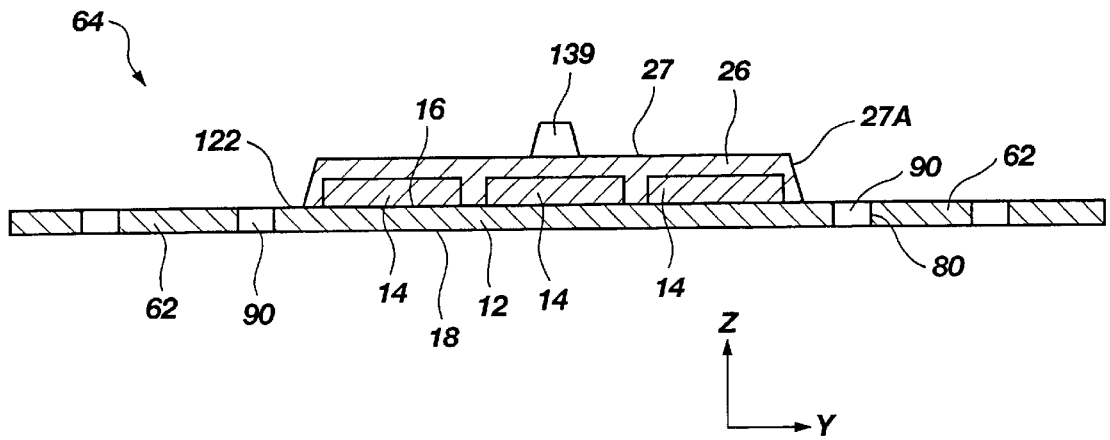
*Fig. 7B*
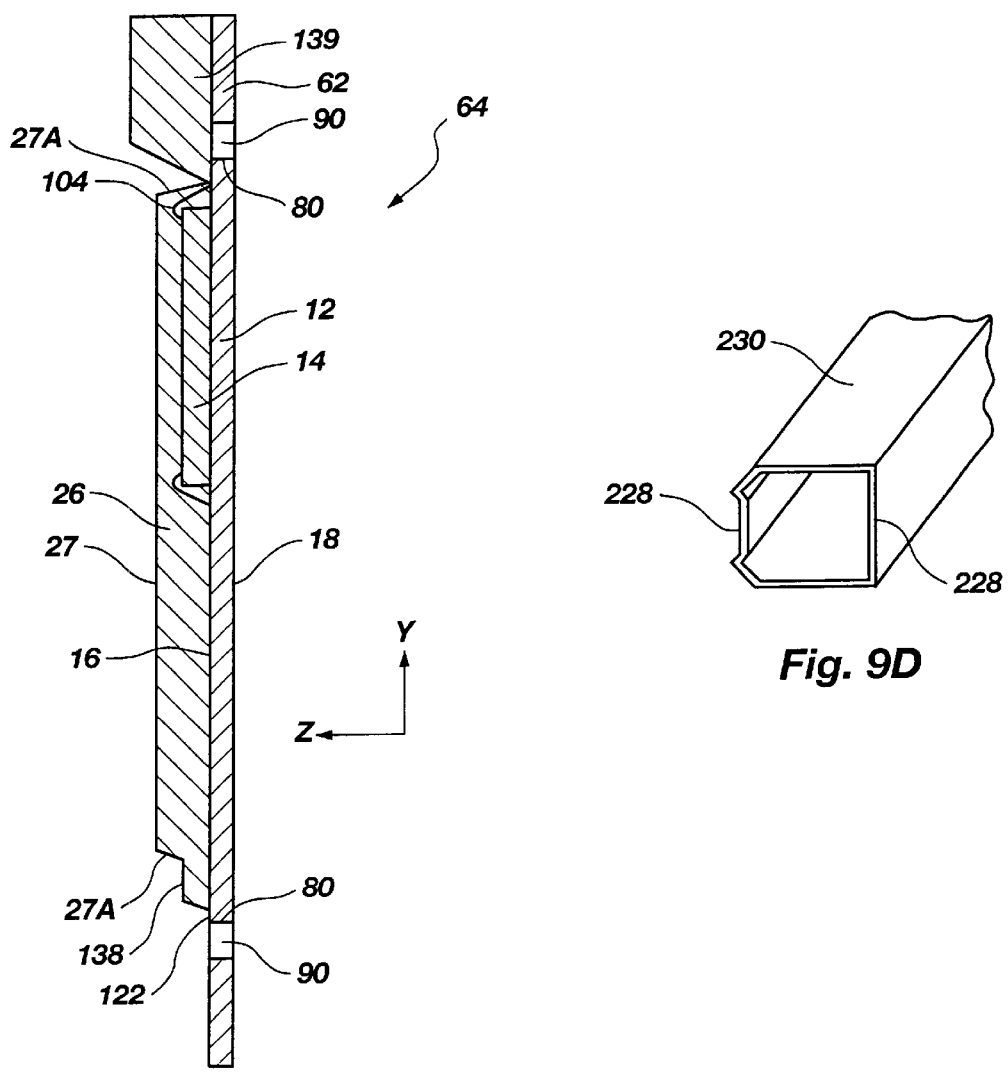
*Fig. 7A*
*Fig. 9D*

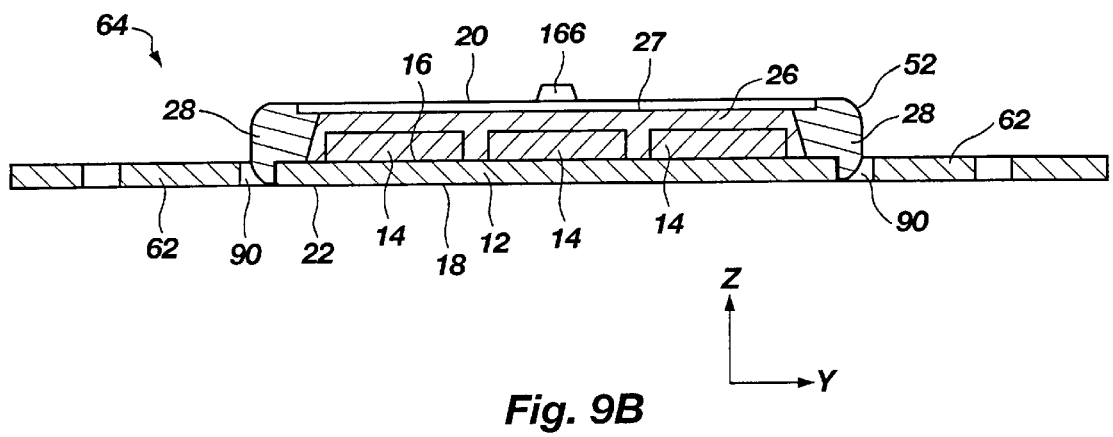
Fig. 9B
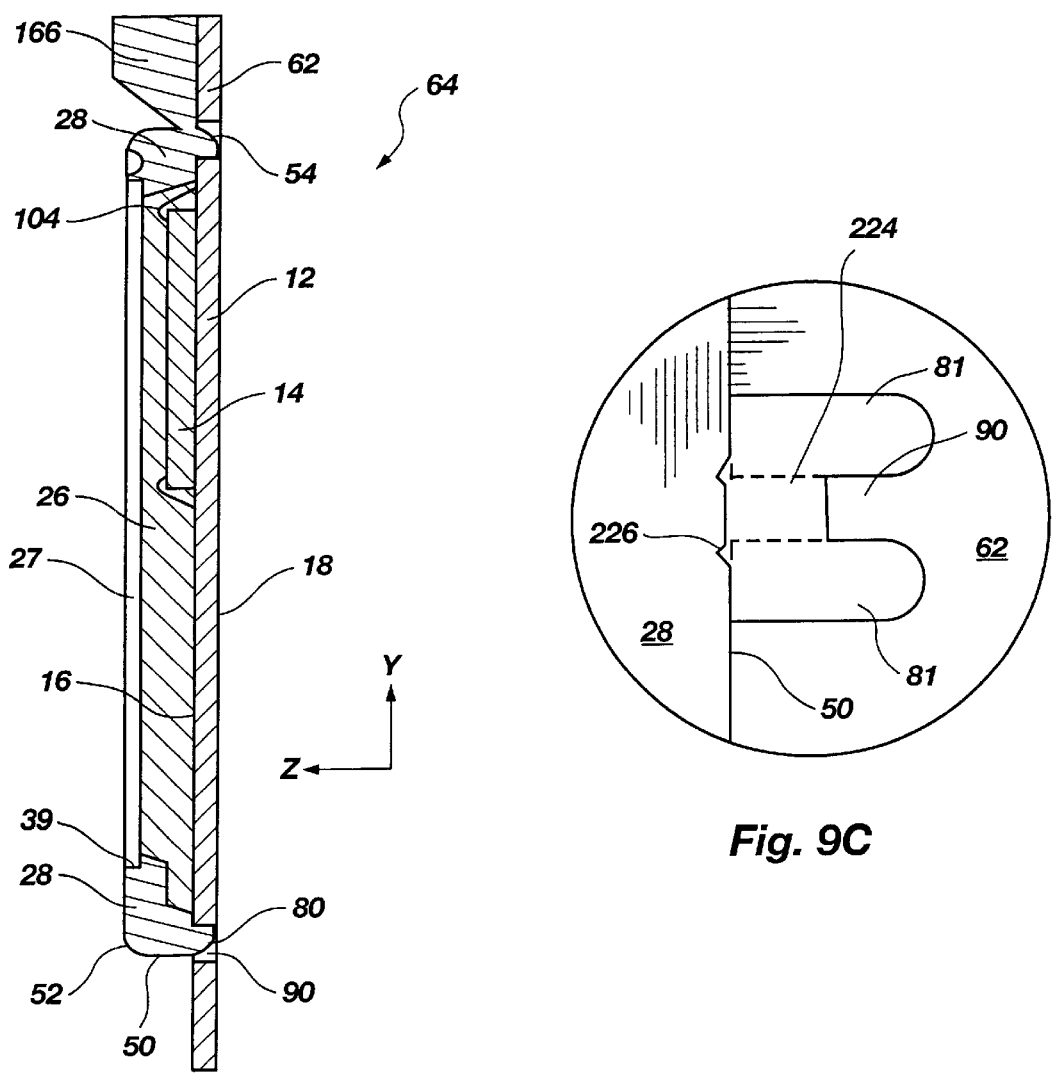
Fig. 9A
Fig. 9C

TWO-STAGE TRANSFER MOLDING METHOD TO ENCAPSULATE MMC MODULE

CROSS-REFERENCE TO RELATED APPLICATION

This application is a divisional of application Ser. No. 09/879,171, filed Jun. 12, 2001, now U.S. Pat. No. 6,444,501 B1, issued Sep. 3, 2002.

BACKGROUND OF THE INVENTION

1. Field of the Invention

This invention relates generally to semiconductor manufacture. More particularly, the invention pertains to an improved semiconductor card and to improved methods and systems for fabricating the card.

2. State of the Art

One type of electronic assembly containing semiconductor components is generally referred to as a "card." Examples of such "cards" include multimedia cards (MMC) such as used in digital cameras and the like, memory cards, smart cards, and personal computer memory card international association (PCMCIA) cards. In the industry, these types of cards are sometimes referred to collectively as "semiconductor cards," "multimedia cards" or "daughter boards."

Typically, a semiconductor card is formed from a substrate, which may be a thin, printed circuit board (PCB) upon which electronic components are mounted. Such components may include, for example, at least one semiconductor die and/or die package as well as resistors, capacitors, inductors and the like to form a desired circuitry. The substrate includes conductors for providing power supply and interconnection of the various components. Typically, the components are mounted on one side, i.e., the "circuit" side of the substrate, and are electrically interconnected to external contacts on the opposing side by interlevel conductors. The external contacts are arranged for electrical contact with a next level package, i.e., mother board. In use in an exemplary electronic apparatus, such as a digital camera, the card may be inserted into a slot or other receiver for interconnection with a motherboard and to provide, for example, flash memory for digitally recorded images.

Semiconductor cards are typically intended for repeated handling by the public, necessitating protection of the components from mechanical forces, moisture, radiation and stray electrical currents, etc. In addition, the surface materials of the card must be resistant to normal wear and tear. This is particularly true in peripheral portions of the card. In the industry, the semiconductor components and interconnecting conductors on the circuit side of a card substrate have typically been encapsulated by first applying "glob top" encapsulant. Then, a separately formed protective cover produced by injection molding is adhesively attached over the circuit side of the substrate to form the semiconductor card. However, use of a separately formed cover not only adds undesirable thickness to the card but requires additional process steps and is subject to deleterious detachment of the cover from the substrate. In addition, any variation in mounted component height and overlying glob top material will result in card thickness variation.

For most applications, it is desirable to make the card as thin as possible. The use of thin cards saves space within the equipment in which the card is used, as well as storage space, and a savings in encapsulation material is also realized.

A further requirement for semiconductor cards is that the peripheral outlines and card dimensions be as smooth and uniform as possible, so that proper effective insertion into a card receiver is assured. The edges should not have any burrs. Specifications on the peripheral outline and dimensions of semiconductor cards have been set by various industry standard setting bodies, e.g., PCMCIA.

In present methods of manufacture, components for several semiconductor cards are fabricated and wire bonded on a strip of, e.g., circuit board. The strip may be viewed as equivalent to the lead frame in die manufacture. The individual cards are then separated from the strip using a singulation process such as sawing. Often the singulation step produces slivers or burrs and may form card edges which are rough or sharp. These defects can adversely affect the peripheral outline, dimensions, appearance and use of the card.

The need exists for a semiconductor card having improved uniformity in peripheral outline, dimensions, appearance, edge smoothness and performance. A method for producing an improved semiconductor card with reduced expenditure of time and materials is needed. In addition, the desired method will produce a card with improved precision in peripheral outline, dimensions and appearance, and at lower cost.

BRIEF SUMMARY OF THE INVENTION

In accordance with the present invention, an improved semiconductor card is provided. The method of fabricating the improved card uses two molding steps and eliminates the need for glob top, cap molding and cap attachment. The method is rapid and uses molding processes well-known in the industry. In addition, the use of two molding steps makes available a variety of options not otherwise available. In addition, the method effectively eliminates resin bleed into areas intended to be left uncovered. The fabrication method provides cards with an enhanced degree of dimensional uniformity and reliability.

The semiconductor card includes a substrate such as a printed circuit board (PCB). The substrate comprises an electrically insulative material such as an organic polymer resin reinforced with glass fibers and may include more than one layer.

A substrate may be initially formed as part of a substrate strip containing more than one substrate-frame module. Each substrate is defined by a peripheral opening in the module. The strip is similar in function to a semiconductor lead frame and permits various fabrication processes to be performed on one or more substrates at the same time. The substrate is connected to the strip with connecting segments similar to tie bars on a semiconductor lead frame. The substrate has a circuit side with a pattern of conductors thereon and an opposing back side with a pattern of external contacts thereon. Electronic components such as semiconductor dice, resistors, capacitors, and the like are formed or mounted on the circuit side of the substrate. The semiconductor dice may comprise, for example, bare dice wire bonded to the conductors, bumped dice flip chip mounted to the conductors, or semiconductor packages bonded to the conductors.

In two molding steps, a first plastic body is first formed on the circuit side of the substrate to encapsulate the circuit components including semiconductor components; a second plastic body is then molded to complete the desired card geometry. Typically, a "transfer molding" apparatus is used for each molding step, but the cavity configuration for each step is different.

The first molding step is similar to well-known methods for chip-on-board (COB) molding wherein semiconductor components are encapsulated to a circuit board. In the first molding step, peripheral portions of the circuit side of the substrate are left uncovered, to be covered by a second plastic body in a second molding step.

In the second molding step, the second plastic body is formed on the peripheral portions of the circuit side and extending laterally therefrom to cover the substrate edge. The second body may also extend over portions of the back side of the substrate. To prevent bleeding of mold resin to the back side of the substrate, a major portion or all of the substrate back side is forced against a mold plate by pressure of the opposite mold plate on the first plastic body.

The first and second molding steps may use different resins to maximize both circuit protection and card life.

The use of two molding operations enables a wide variety of optional card configurations. Several representative embodiments of the second molding step are described herein, each using a particular configuration of mold plates.

Following the second molding step, the card is cut from the surrounding frame. Singulation of the card from the frame or strip results in a card having a smooth, burr-free peripheral edge which has a rounded, oblique or other desirable edge shape. Exposed ends of connecting segments may be recessed into notches formed into the card edges.

BRIEF DESCRIPTION OF THE DRAWINGS

FIG. 7A is an enlarged cross-sectional side view, with exaggerated dimensions along the Z-axis, of a module containing a circuitized substrate following application of a first plastic casting thereon in the fabrication of a semiconductor card in accordance with the invention;

FIG. 7B is an enlarged cross-sectional end view, with exaggerated dimensions along the Z-axis, of a module containing a circuitized substrate following application of a first plastic casting thereon in the fabrication of a semiconductor card in accordance with the invention;

FIG. 9A is an enlarged cross-sectional side view, with exaggerated dimensions along the Z-axis, of a module containing a circuitized substrate following application of a second plastic casting thereon in the fabrication of a semiconductor card in accordance with the invention;

FIG. 9B is an enlarged cross-sectional end view, with exaggerated dimensions along the Z-axis, of a module containing a circuitized substrate following application of a second plastic casting thereon in the fabrication of a semiconductor card in accordance with the invention;

FIG. 9C is an enlarged plan view of a portion of a semiconductor card module following singulation, in accordance with the invention and taken from area 9C of FIG. 9;

FIG. 9D is an enlarged perspective view of a cutter die;

DESCRIPTION OF THE ILLUSTRATED EMBODIMENTS

Figure 4:
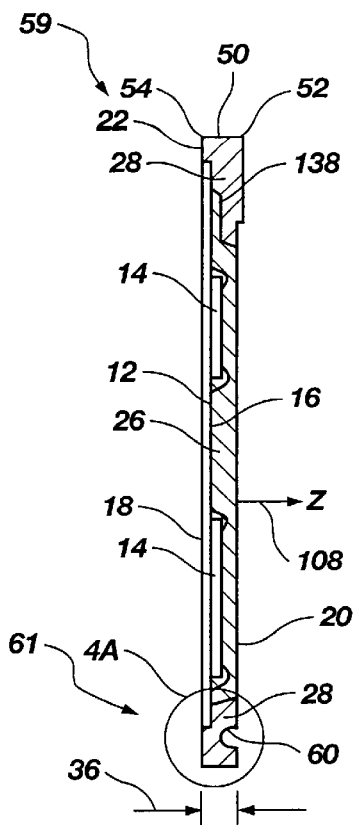
FIG. 4 is an enlarged cross-sectional side elevation view of the semiconductor card of the invention, as taken along section line 4—4 of FIG. 2.
Figure 3:
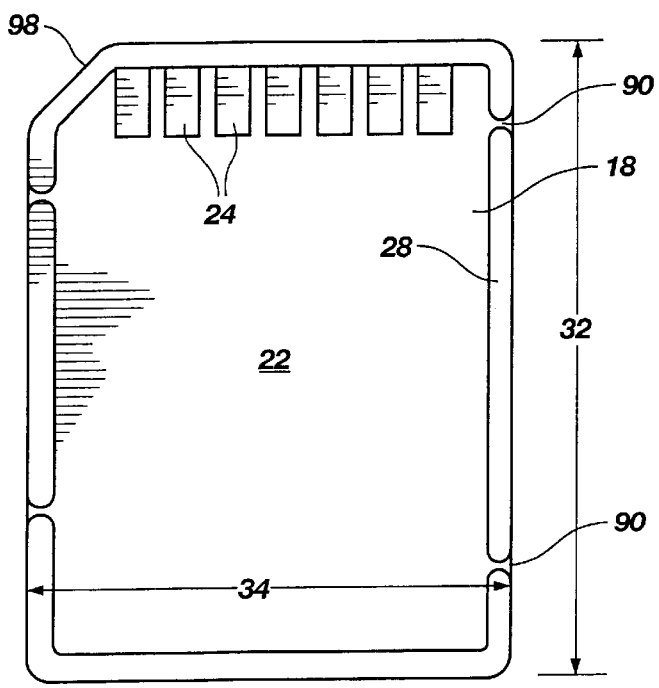
FIG. 3 is an enlarged bottom view of a semiconductor card of the invention.

The invention is described and illustrated hereinbelow in terms of a semiconductor card 10 which is exemplified by a so-called "multimedia card" depicted in drawing FIG. 1. The semiconductor card 10 is shown in reference to x-axis 106, y-axis 107, and z-axis 108. The semiconductor card 10 includes a substrate 12 and at least one semiconductor component 14 mounted to the front (i.e., circuit) side 16 of the substrate as part of a semiconductor card circuit 15 (see FIG. 5). The semiconductor card 10 is shown with an array of external contacts 24 (see FIG. 3) mounted on the back side 18 of the substrate 12 to provide electrical connection with another circuit, not shown. Thus, for example, a semiconductor card 10 containing memory (e.g., flash memory) may be configured for removable insertion into photographic devices for digital recording and retrievable storage of still pictures or video and, optionally, audio. The exemplary semiconductor card 10 has a first end, which will be termed herein as the insertable end 59, and a second end, which is an opposing noninsertable end 61 (see FIG. 4).

The semiconductor card 10 also has a first molded plastic casting 26 which is molded onto the circuit side 16 of the substrate 12 to encapsulate the semiconductor component 14. Other electric components 13 (see FIG. 5) on the circuit side 16 may also be encapsulated by the first molded plastic casting 26. Surrounding the first molded plastic casting 26 is a second molded plastic casting 28 which generally abuts the first plastic casting, enclosing the peripheral edge 30 of the substrate 12 to comprise exterior portions of the semiconductor card 10.

As shown in drawing FIGS. 1 through 4, semiconductor card 10 has a length 32, width 34 and thickness 36. The thickness 36 may typically be set at a desirable value in the range of about 1 mm to about 6 mm. In an exemplary multimedia semiconductor card 10 described herein, the length 32, width 34, thickness 36 and other aspects of the card may be set by an industry standards group, or, alternatively, the card configuration may be decided by each manufacturer. In the particular example shown, the semiconductor card 10 has a length 32 of about 32 mm, a width 34 of about 24 mm, and a typical thickness 36 of about 1–3 mm.

Figure 1:
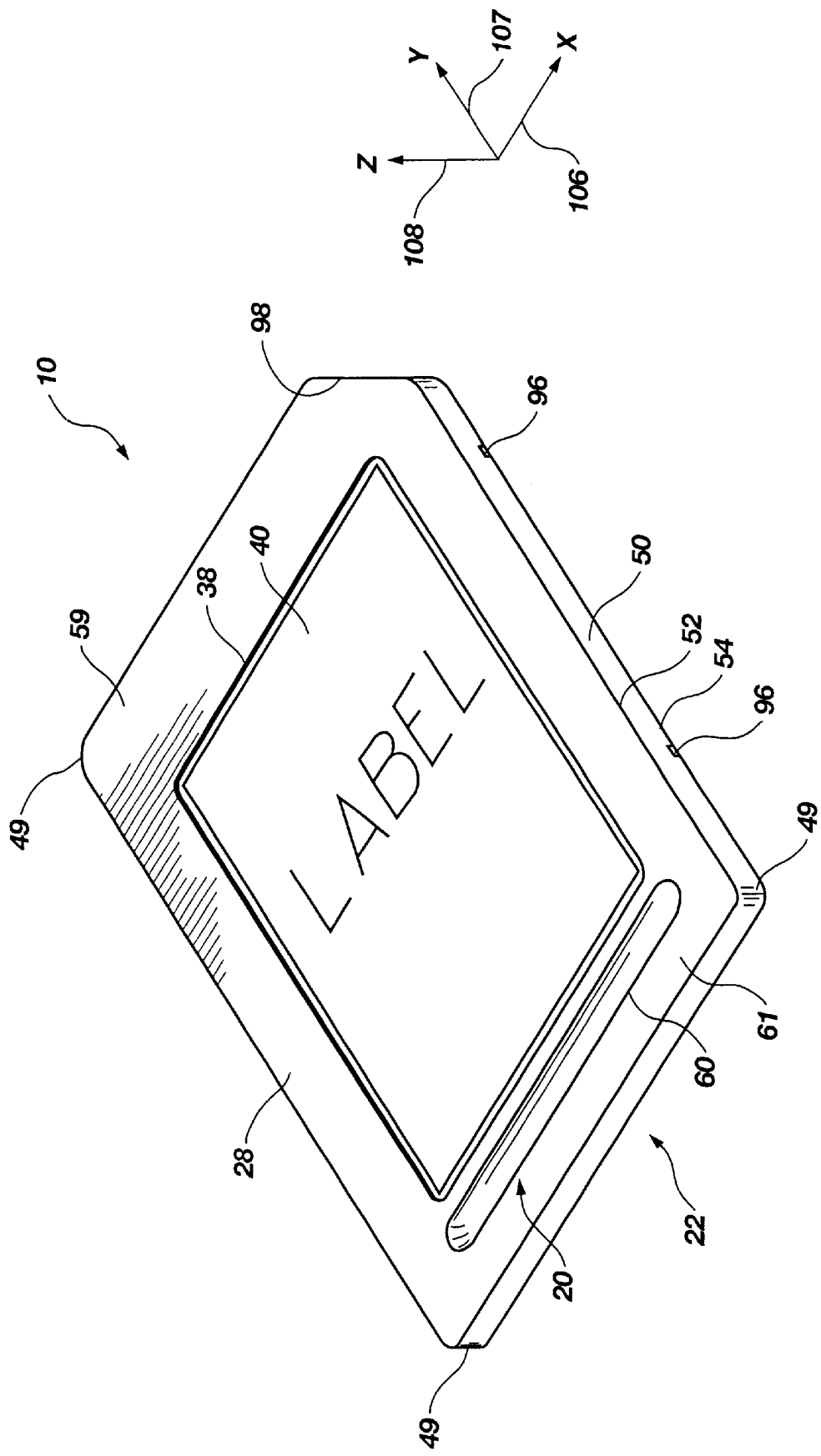
FIG. 1 is an enlarged top perspective view of a semiconductor card fabricated in accordance with the invention.
Figure 2:
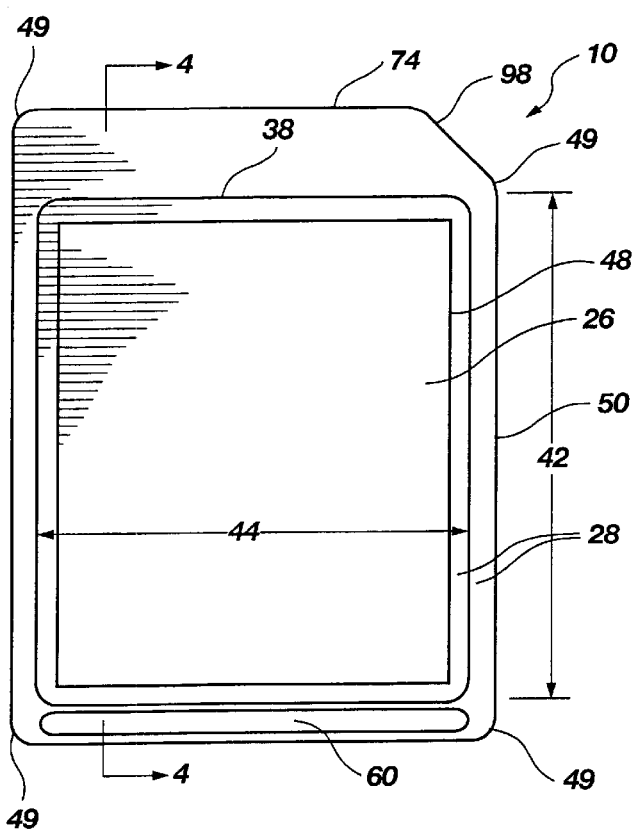
FIG. 2 is an enlarged plan view of a semiconductor card fabricated in accordance with the invention.
Figure 4A:
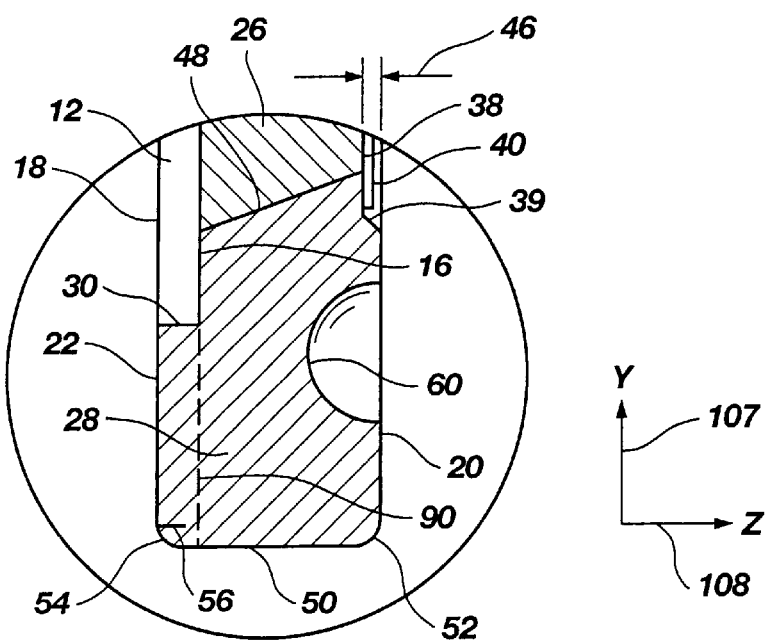
FIG. 4A is an enlarged cross-sectional view through an edge of a semiconductor card as taken through area 4A of FIG. 4.
Figure 4B:
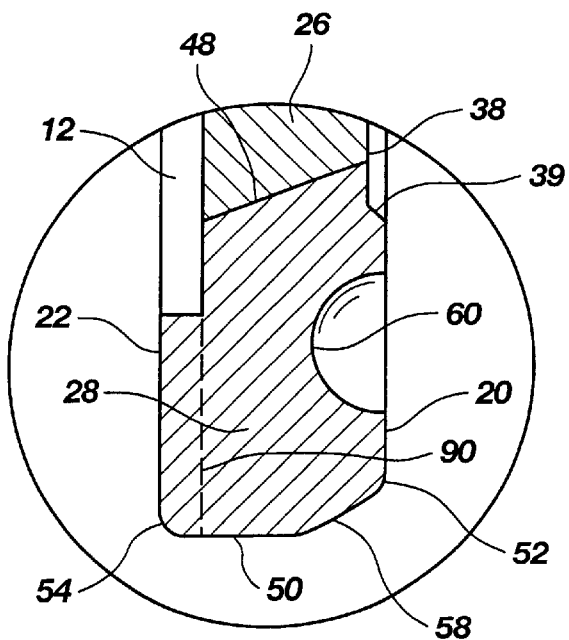
FIG. 4B is an enlarged cross-sectional view through an edge of another embodiment of a semiconductor card as taken through area 4A of FIG. 4.

As depicted in drawing FIGS. 1 and 2, the exemplary semiconductor card 10 may include a slightly depressed label area 38 for attachment or inking of a label 40 on the circuit side 16. The label area 38 is defined by a periphery 39 and is shown with an exemplary length 42, width 44, and depth 46 (see FIGS. 2, 4A and 4B) which depend upon the dimensions of the label 40. As shown in FIGS. 2, 4A and 4B, the label area 38 may be configured to conceal the interface 48 between the first and second molded plastic castings 26, 28 behind the attached label 40.

The front side 20 and back side 22 of the semiconductor card 10 are joined by a peripheral edge 50 having rounded corners 49. As shown in drawing FIGS. 4A and 4B, the juncture 54 of the card's back side 22 with peripheral edge 50 is generally rounded, typically with a radius 56 such as about 0.1 to about 0.4 mm. Likewise, the juncture 52 of the card's front side 20 with peripheral edge 50 may be rounded. Alternatively, juncture 52 may include an oblique face 58. The smooth, nonsharp junctures 52, 54 enhance safety, i.e., to avoid finger cuts, and ensure ease of use. By way of example, a typical radius 56 of about 0.20 mm is shown.

For ensuring easy retrieval of semiconductor card 10 from the receiving slot of an apparatus (not shown), a groove 60 may be formed in the card at the noninsertable end 61, preferably on the front face 20. The groove 60 acts as a finger grip or fingernail grip. The groove 60 is shown as a feature of the second molded plastic casting 28.

As illustrated, drawing FIGS. 4A and 4B also show by hatch lines the hidden connecting segments 90 in the second molded plastic casting 28 of this embodiment.

Figure 5:
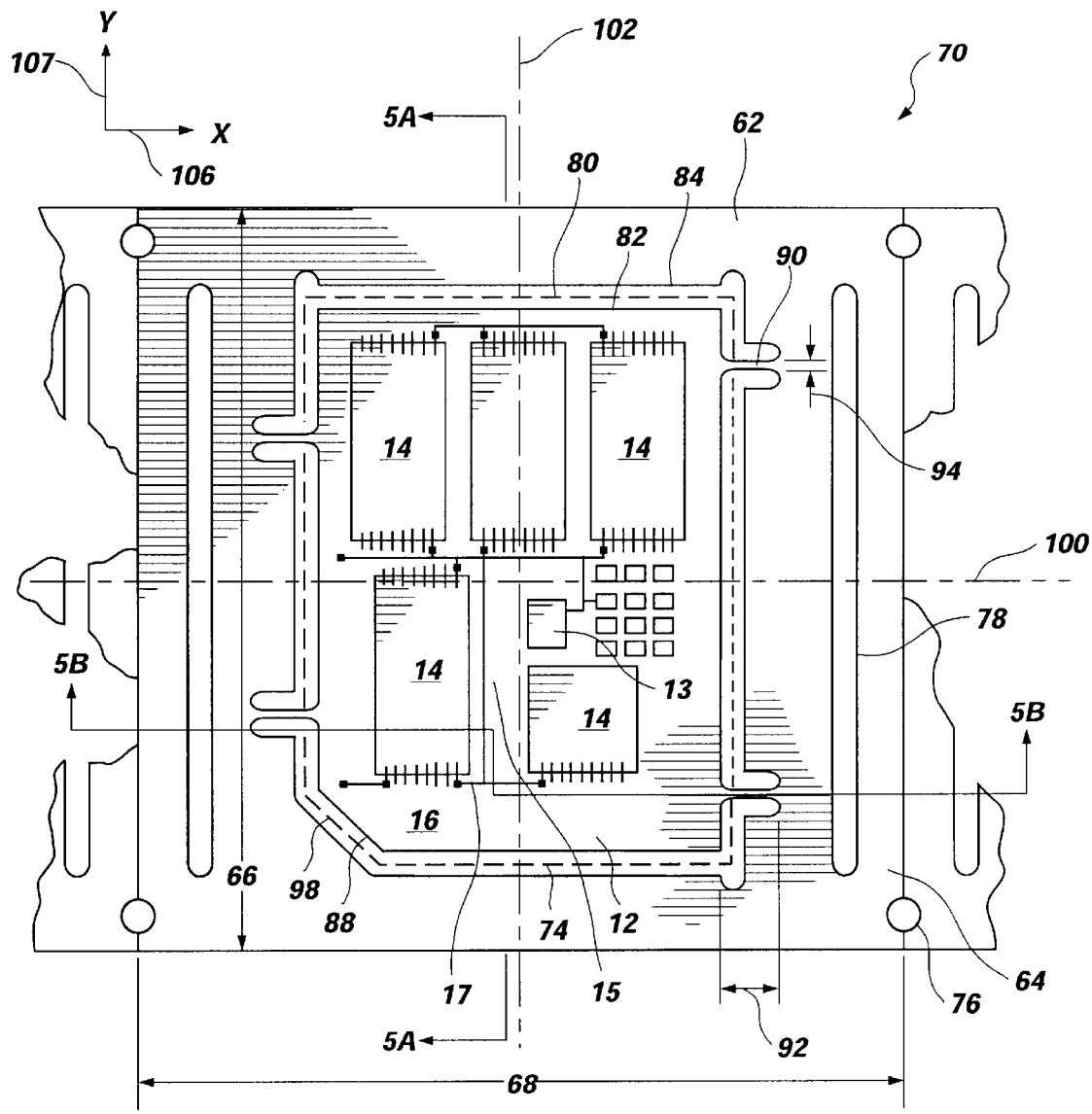
FIG. 5 is an enlarged plan view of a module containing a circuitized substrate of a semiconductor card of the invention.

Turning now to drawing FIG. 5, module 64 is shown as one of several modules on a strip 70. The module 64 comprises a substrate 12 together with a surrounding frame 62 to which the substrate is attached by connecting segments 90. The primary manufacturing steps in this invention are directed to a substrate 12 in modular form. In strip form, multiple modules 64 may be used to fabricate more than one semiconductor card 10 at the same time. In this exemplary description, a single module 64 is used to illustrate the method of fabrication.

In drawing FIG. 5, a module 64 including substrate 12 is depicted as a thin sheet formed of an electrically insulating material such as an organic polymer resin reinforced with glass fibers. Suitable materials for the module 64 include bismaleimide-triazine (BT), epoxy resins (e.g., "FR-4" and "FR-5"), and polyimide resins. Any of these materials can be formed as a sheet of the desired thickness and then punched, machined or otherwise formed with a required peripheral configuration and with other desired features. A representative thickness 72 (see FIG. 5B) of the sheet of module 64 can be from about 0.2 mm to about1.6 mm. The module 64 is shown with a width 68 and length 66.

Each substrate 12 is defined by a peripheral opening 80 having inner edge 82 and outer edge 84, the width 66 therebetween being sufficient to provide room for the second molded plastic casting 28 to encase the peripheral edge 30 of the substrate. The peripheral outline 74 (hatched line of FIG. 5) of the produced semiconductor card 10 lies within the peripheral opening 80. The substrate 12 is connected to the frame 62 (and supported thereby) by a plurality of connecting segments 90, which are similar to tie bars used in lead frames for semiconductor manufacture. Lateral extensions 81 of the peripheral opening 80 are shown as providing a desired length 92 of each connecting segment 90. A width 94 of each connecting segment 90 is provided which supports the substrate 12 during processing. The width 94 will depend upon the size, thickness, strength, and ductility of the substrate 12. For fabrication of a semiconductor card 10 having the dimensions indicated above, the connecting segment width 94 is preferably in the range of about 1 to about 3 mm.

The module 64 containing substrate 12 is shown with indexing openings 76 for aligning the substrate 12 with molding apparatus, described infra. The module 64 may contain other openings 78 for other purposes.

As shown in drawing FIG. 5, the peripheral opening 80 may be cut in module 64 to provide substrate 12 with a generally rectangular peripheral shape but with one chamfered corner 88. As shown in drawing FIG. 1, the second molding step produces a semiconductor card 10 having a chamfered corner 98. The purpose of chamfered corner 98 is to generally identify the end of the semiconductor card 10 having external contacts 24 and to ensure that a user inserts the card in a proper orientation. However, the invention applies to a semiconductor card 10 or a substrate 12 of any shape. Also shown in drawing FIG. 1 are exposed ends 96 of connecting segments 90 in the as-molded semiconductor card 16 after molding of the molded plastic castings 26, 28 and singulation from the frame 62. See also drawing FIG. 3.

Figure 5B:
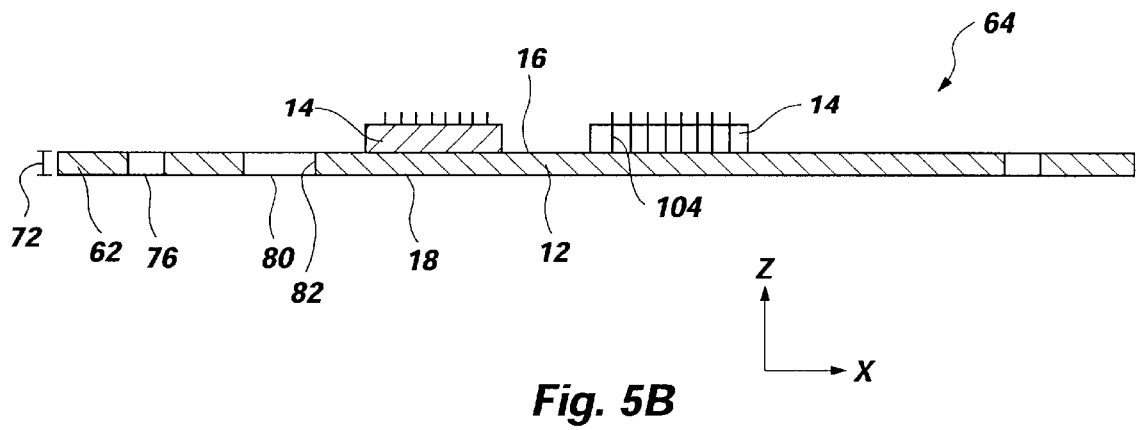
FIG. 5B is an enlarged cross-sectional end view of a module containing a circuitized substrate for fabricating a semiconductor card of the invention with exaggerated dimensions along the Z-axis, taken along section line 5B—5B of FIG. 5.
Figure 5A:
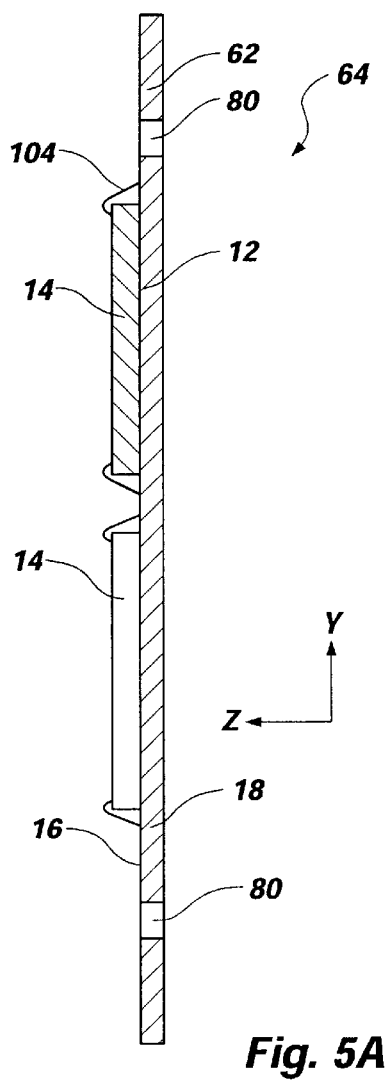
FIG. 5A is an enlarged cross-sectional side view of a module containing a circuitized substrate of a semiconductor card of the invention with exaggerated dimensions along the Z-axis, as taken along section line 5A—5A of FIG. 5.

The substrate 12 includes a circuit side 16 and an opposing back side 18 (see FIGS. 4A, 4B and 5) which in this embodiment largely comprises the card's back side 22. In drawing FIG. 5, a first reference line 100 and a second reference line 102 are center lines of module 64. Peripheral edge 30 of substrate 12 joins the circuit side 16 and the back side 18 (see FIG. 4A). As illustrated in the typical substrate 12 of drawing FIGS. 5, 5A and 5B, the circuit side 16 has mounted therein semiconductor components 14 as well as electrical components 13 such as resisters, capacitors, inductors or other components as required by the card circuit 15. A card circuit 15 is completed by connecting the semiconductor components 14, electrical components 13 and external contacts 24 (see FIG. 3) with a pattern of conductors 17, e.g., wires, printed conductors, vias, and the like. For example, drawing FIGS. 5A and 5B show semiconductor components 14 connected with bond wires 104. Only a few other conductors 17 are shown in these figures for the sake of clarity. The conductors 17 may include additional contacts (not shown) to establish test circuits, for example, on either side of the substrate 12. Methods and apparatus for forming, attaching and conductively interconnecting components 13, 14, and 17 are well known in the art.

The external contacts 24 are configured for mating electrical engagement with corresponding contacts (not shown) on a mother board circuit or other electrical assembly (not shown). As illustrated, the external contacts 24 may be planar pads formed of a nonoxidizing conductive material such as gold. However, other configurations for the external contacts 24 may be used, including bumps, pins, or pillars, for example, where the particular application permits. The card circuit 15 comprises the sum of items 13, 14, 17, 24 and 104 which are mounted on the substrate 12.

In prior art processes for making semiconductor cards, semiconductor components and electrical components on the substrate are encapsulated with a glob-top material which is cured prior to cementing a separately formed cap over the substrate. The invention presented herein avoids problems inherent in prior processes, using two molding steps to form the semiconductor card 10 over a substrate 12. As described herein, a first molding step substantially encapsulates components of the card circuit 15 while at the same time forming a platform effective for compressing the substrate 12 in a second molding step. Thus, bleeding of molding resin onto the back side 18 of the substrate 12 is prevented. Smooth card surfaces are produced including outer surfaces of the semiconductor card 10 and rounded or drafted (beveled) peripheral card edge 50.

Semiconductor card 10 of the invention includes a first molded plastic casting 26 which is molded directly to the circuit side 16 of substrate 12, covering semiconductor component(s) 14 and electrical component(s) 13, and may cover exposed conductors, bond pads, etc. which are mounted thereon. In the figures, bond wires 104 are shown encapsulated within the first molded plastic casting 26.

Figure 6:
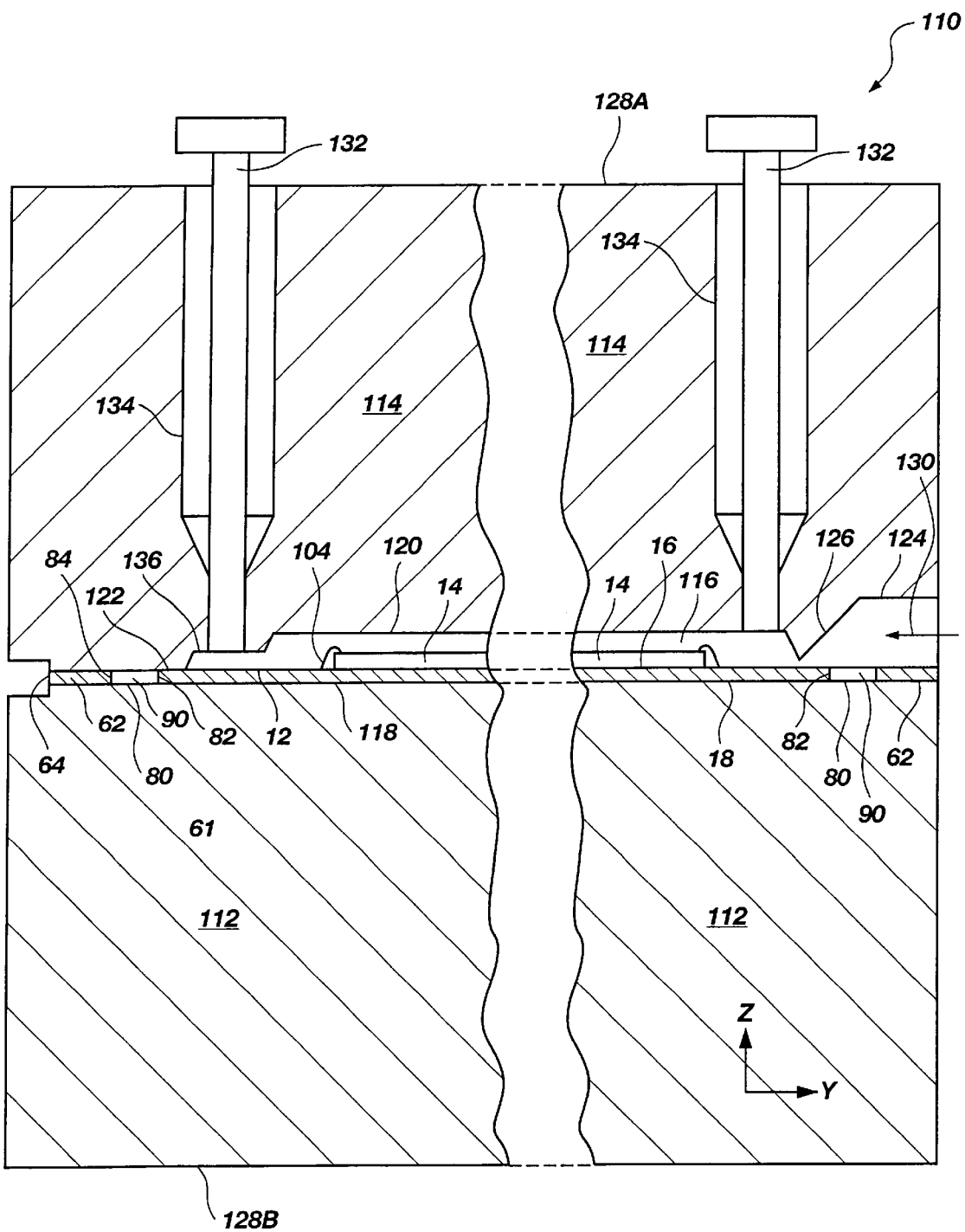
FIG. 6 is a partial enlarged cross-sectional view of a molding assembly configured to mold a first plastic casting on a circuitized substrate in accordance with the invention.

As shown in drawing FIG. 6, a first molding assembly 110 is of a type generally characterized as a transfer mold with mating first (e.g., lower) plate 112 and second (e.g., upper) plate 114 which clamp a module 64 therebetween. As known in the art, such first molding assembly 110 will include an internal mold cavity 116 having surface 118 in the lower plate 112, surface 120 in the upper plate 114, and alignment features, not shown, for precise joining of the plates under clamping pressure. In addition, there is a feed runner 124 and feed gate 126 for introducing a first flowable molding resin 130 into the mold cavity 116.

Substrate 12 extends between inner edges 82 of peripheral opening 80. The substrate 12 is connected to the frame 62 by connecting segments 90 which span the peripheral openings 80 from frame 62 to substrate 12.

As shown in drawing FIG. 6, the first (lower) plate 112 may have a generally flat molding surface 118 upon which the back side 18 of the substrate 12 with attached frame 62 is mounted. The lower plate 112 has a bottom 128B.

The second (upper) plate 114 has a mold cavity 116 with molding surface 120 for molding the first molded plastic casting 26 on the circuit side 16 of substrate 12. The second plate 114 is supported by a bottom 128B. The surface 120 is configured to leave a peripheral area 122 of the substrate 12 uncovered by resin 130. This peripheral area 122 will be covered by the second molded plastic casting 28 in a subsequent step. In the embodiment shown in drawing FIG. 6, a step 136 is shown in the cavity surface 120, near the left side of the figure, corresponding to the noninsertable end 61 of the finished semiconductor card 10. This step 136 forms a corresponding step portion 138 (see FIGS. 4 and 7) in the first molded plastic casting 26 to be covered by the second molded plastic casting 28. This feature allows formation of a depressed label area 38 which covers a limited portion of the card's front side 20, while at the same time ensuring that (a) all circuit elements on the circuit side 16 are covered by a first molding resin 130, and (b) nonlabel portions of the card's front side 20 are formed of a different molding resin. Optionally, the upper plate 114 may be configured to form a first molded plastic casting 26 of uniform upper surface 27, or with a step portion 138 at any desired location. In any case, the first molded plastic casting 26 comprises a platform which may be motivated downwardly to prevent resin leakage in a second molding step.

To form the first molded plastic casting 26, a module 64 with circuitized substrate 12 is mounted between the lower plate 112 and the upper plate 114. Ejection pins 132 are inserted into pin holes 134, to be even with the surface 120 of upper plate 114. Fluid molding resin 130 is introduced under pressure into feed runner 124 and past the rate limiting gate 126 to fill the mold cavity 116. Following hardening of the resin 130, the plates 112, 114 are disassembled. Ejection pins 132 are then motivated to push the first molded plastic casting 26 including module 64 from the mold cavity 116 of upper plate 114.

Figure 7:
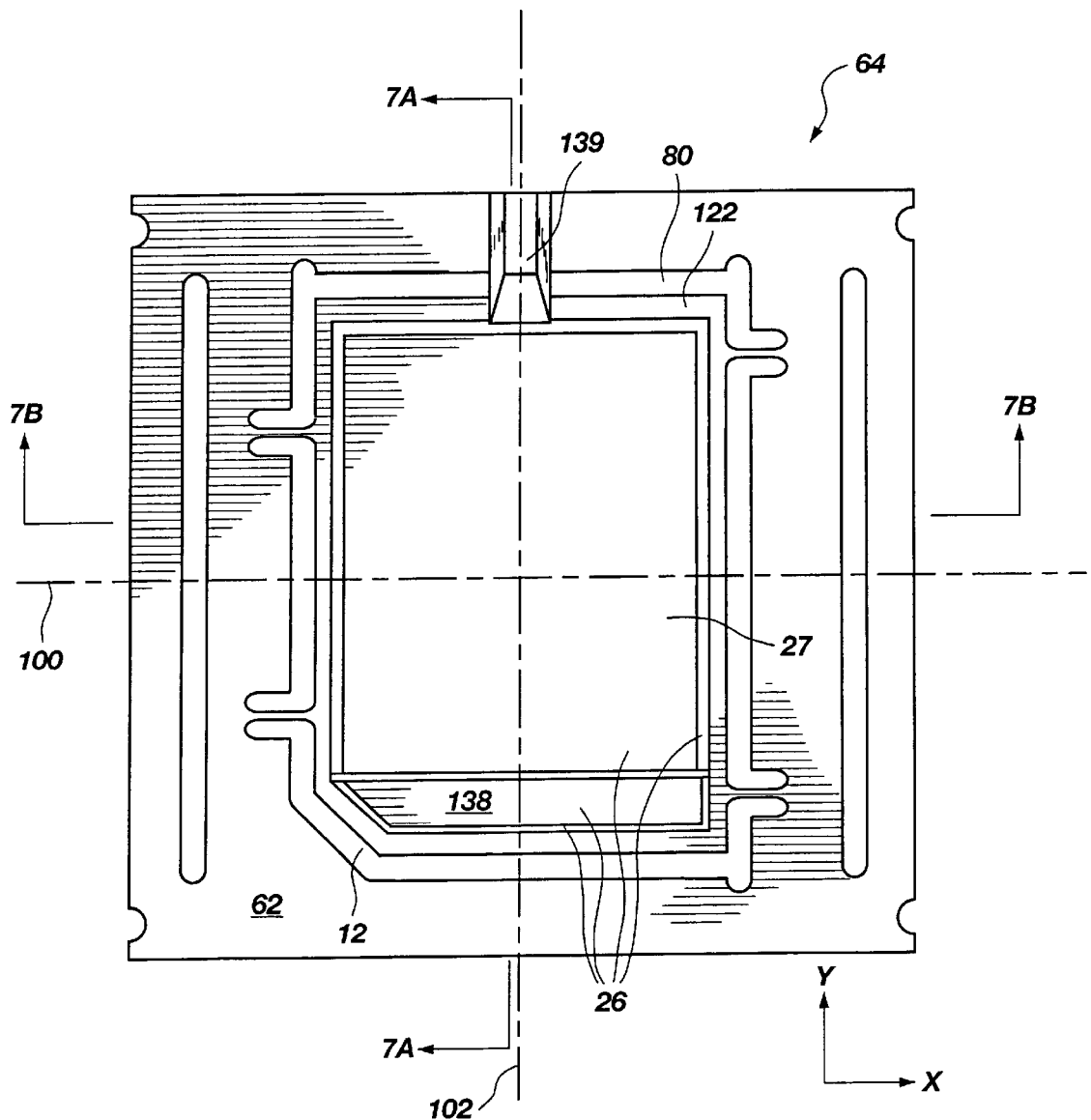
FIG. 7 is an enlarged plan view of a module containing a circuitized substrate following application of a first plastic casting thereon in the fabrication of a semiconductor card in accordance with the invention.
Figure 8:
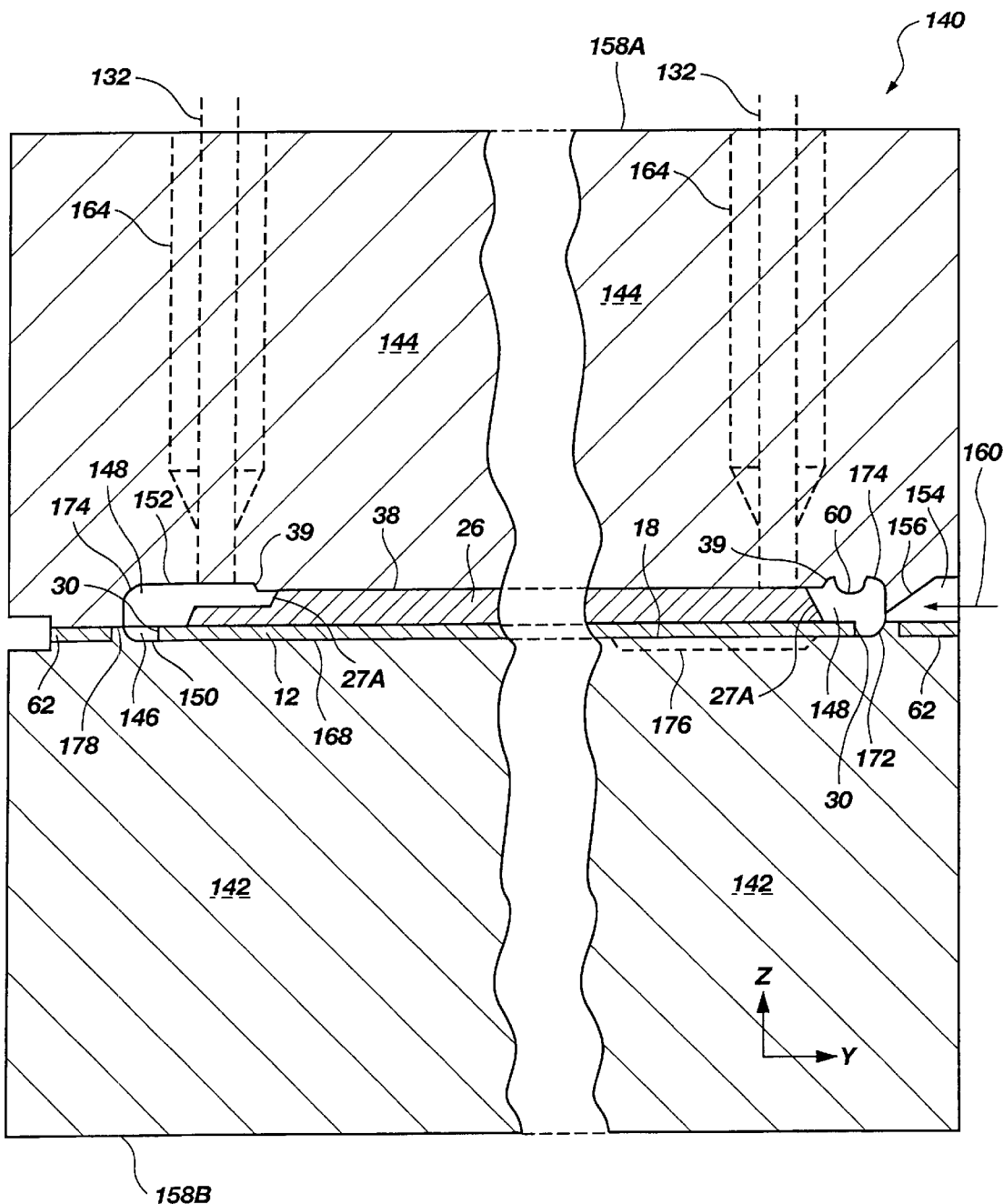
FIG. 8 is a partial enlarged cross-sectional view of a molding assembly configured to mold a second plastic casting on a circuitized substrate having its circuit encapsulated by a first plastic casting, in accordance with the invention.

One embodiment of the module 64 at this stage is shown in drawing FIGS. 7, 7A, and 7B. As depicted, the first molded plastic casting 26 is shown with a generally planar upper surface 27 and includes a step portion 138 which is useful as already noted. The card circuit 15 including semiconductor components 14 as well as electronic components 13, conductors 17, (not visible in FIGS. 7, 7A and 7B), and bond wires 104 are encapsulated within the first molded plastic casting 26. The first molded plastic casting 26 is formed with edges 27A angled to provide for ready separation of the first molded plastic casting 26 from the molding plates. The first molded plastic casting 26 will have an easily removable appendage 139 formed of hardened plastic resin remaining within the feed runner 124 and gate 126. This removal step may be termed "degating."

The second molding step may be conducted in different ways to form semiconductor card 10. A first embodiment of a second molding assembly 140, generally defined as a transfer mold, is pictured in FIGS. 8, 9, 9A, 9B, 9C and 9D. In this embodiment, the molding assembly 140 is configured to perform the molding in which the substrate 12 and frame 62 are coplanar. In these figures, the second molding assembly 140 is shown with a lower molding plate 142 having a lower molding cavity 146 and an upper molding plate 144 having an upper molding cavity 148. The lower molding cavity 146 has a molding surface 150, and the upper molding cavity 148 has a molding surface 152. The upper molding cavity 148 has a surface 152 which contacts and compresses the first molded plastic casting 26 downward to seal the substrate's back side 18 against the lower molding plate 142.

A module 64 having a substrate 12 with a first molded plastic casting 26 encapsulating a semiconductor component (not visible) is positioned in the second molding assembly 140. The lower molding cavity 146 has a smooth surface 150 with a rounded periphery 172.

The upper molding cavity 148 has a smooth surface 152 configured to form a hard second molded plastic casting 28 which abuts the first molded plastic casting 26 and extends over the peripheral edge 30 of the substrate 12. In particular, the periphery 174 of the upper molding cavity 148 is arcuate or rounded or, alternatively, has a substantially oblique face 58 (see FIG. 4B). The latter shape may provide for a module 64 which is more easily removed from the upper molding cavity 148.

The upper molding cavity 148 is connected by a feed runner 154 and gate 156 through which a second flowable molding resin 160 may be introduced into, and fill, the molding cavities 146, 148.

Preferably, the entire or nearly entire back side 18 of the substrate 12 is left uncovered by resin. In order to ensure a fully exposed back side 18, an antiflash material 168 may be applied to the back side 18 prior to fitting the module 64 in the second molding assembly 140. The antiflash material 168 may be applied as a paste, for example, but preferably comprises a thin polymeric film or tape. Such materials are known in the art.

The external contacts 24 (see FIG. 3) may be coplanar with the substrate's back side 18.

In the event that the substrate 12 is configured with external contacts 24 projecting outward from the substrate, the lower plate's molding surface 150 may include a depression 176 for enclosing the projecting contacts. (See FIG. 8.) Antiflash material 168 may be applied to the back side 18 to include coverage of the projecting external contacts 24, preventing formation of flash material which must be removed later.

Following introduction of the second molding resin 160 and hardening thereof, the module 64 with first and second molded plastic castings 26, 28 is removed from the second molding assembly 140. The removal is facilitated by movement of ejection pins 132 against the first and/or second molded plastic casting 26, 28 (see FIGS. 9, 9A and 9B). In drawing FIG. 8, the ejection pins 132 are shown mounted in pin holes 164 in the upper molding plate 144.

Figure 9:
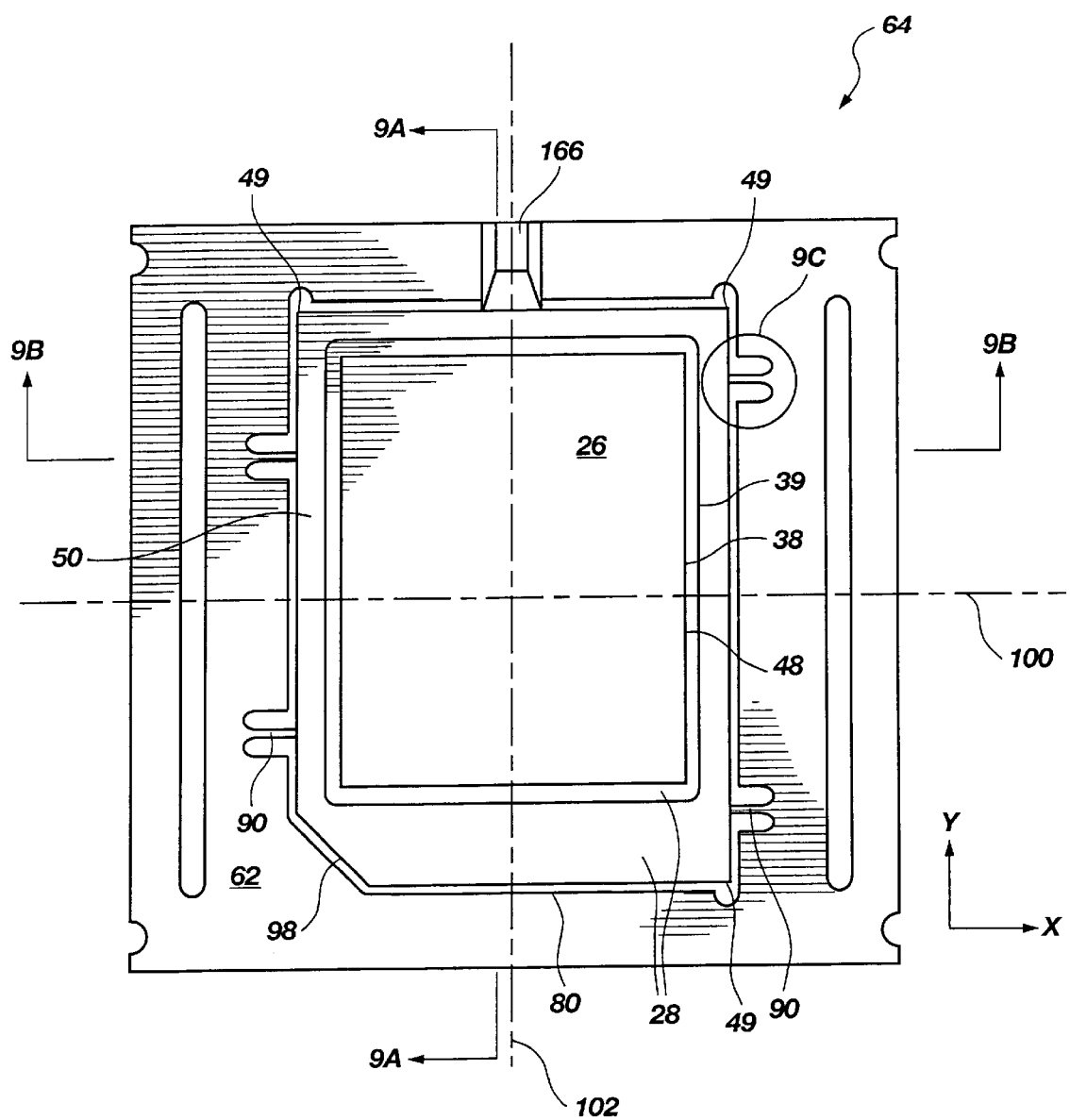
FIG. 9 is an enlarged plan view of a module containing a circuitized substrate following application of a second plastic casting thereon in the fabrication of a semiconductor card in accordance with the invention.
Figure 10:
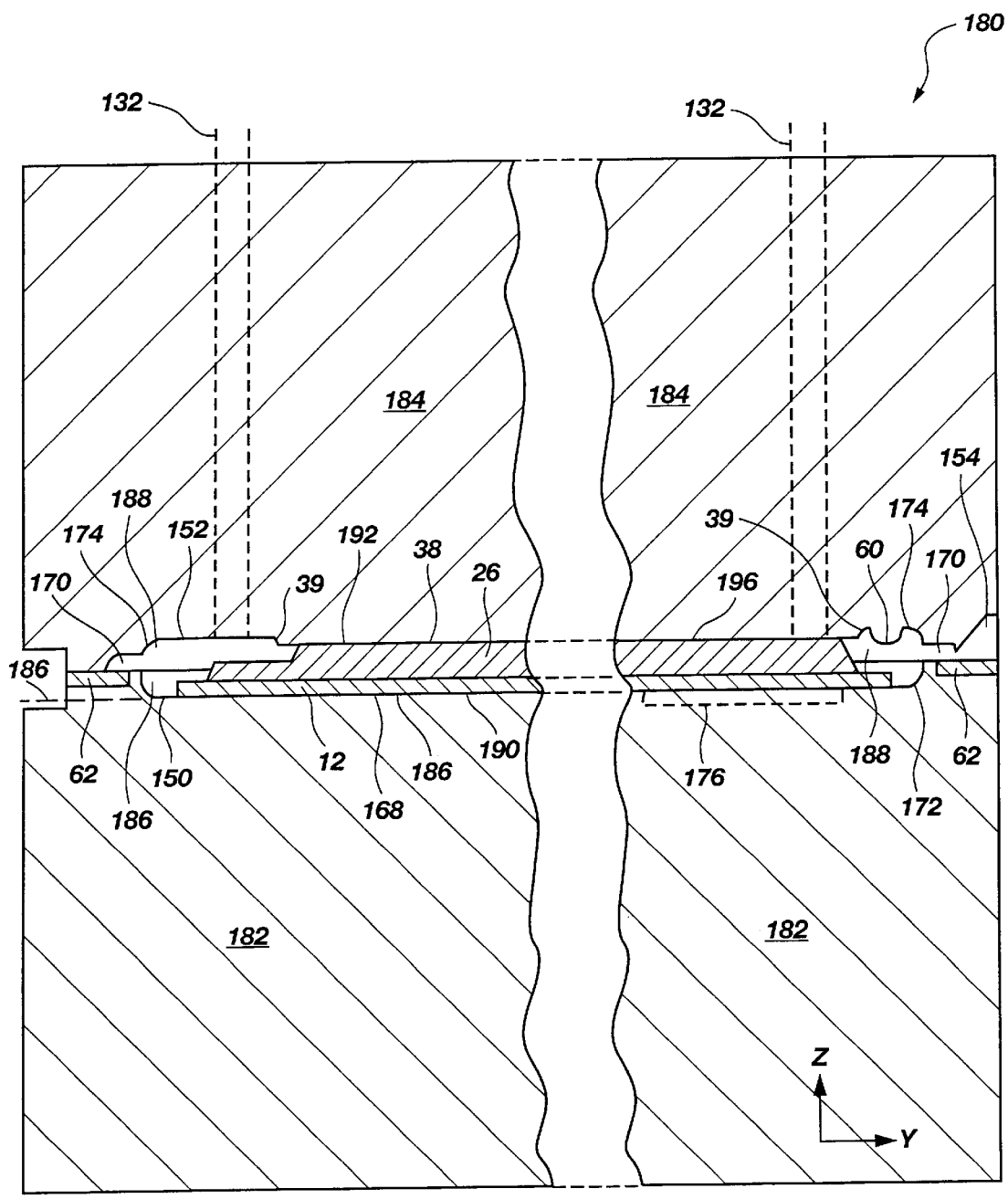
FIG. 10 is a partial enlarged cross-sectional view of a molding assembly configured to mold a second plastic casting on a circuitized substrate having its circuit encapsulated by a first plastic casting, in accordance with another embodiment of the invention.

The module 64 removed from the second molding assembly 140 is depicted in FIGS. 9, 9A, and 9B. In drawing FIGS. 9A and 9B, dimensions are exaggerated along the Z-axis for ease of viewing. At this stage, the module 64 includes the semiconductor card 10 still connected to the frame 62 by connecting segments 90 and to a runner/gate appendage 166. The appendage 166 is then removed and the semiconductor card 10 singulated from the frame 62 by cutting or punching the connecting segments 90 adjacent the card peripheral edge 50 with a cutter die or punch 230. A cutter die 230 may have a general shape of cutters 228 shown in drawing FIG. 9D, for example.

As shown in drawing FIG. 9C, a preferred punch configuration will punch out a chad 224 including a portion of the connecting segment 90 and notch portions 226 in the card peripheral edge 50. Any flash material which may be formed at the plate interface 178 (see FIG. 8) may be physically removed, i.e., deflashed. The resulting semiconductor card 10 is as depicted in drawing FIG. 1.

Another method for forming the second molded plastic casting 28 will now be discussed in reference to drawing FIGS. 10, 11, 11A and 12. The steps for providing a substrate 12 with a first molded plastic casting 26 are as previously described and shown. In drawing FIGS. 10 and 11, a preferred molding assembly 180 for a second molding step is pictured, including a first or lower plate 182 and a second or upper plate 184. In this embodiment, the substrate 12 is pressed downward to a lower plate surface 190 which is at a level offset relative to the frame 62. The substrate 12 and first molded plastic casting 26 are pressed downwardly by contact of the upper plate surface 192 on the upper surface 196 of the first molded plastic casting 26. While similar in shape to the upper molding cavity 148 of drawing FIG. 8, the cavity also includes a laterally extending wing or flange portion 170. Each wing portion 170 spans a peripheral opening 80 in the module 64, extending onto the frame 62. The noncoplanar substrate 12 and frame 62 remain connected by stretched connecting segments 90.

Following introduction of a second molding resin 160 through the feed runner 154 into the mold cavities 186, 188, the resin is permitted to harden. The module 64 may then be removed from the molding assembly 180 by disassembling the lower and upper plates 182 and 184, assisted by activation of ejection pins 132. The twice-molded module 64 is shown in drawing FIG. 11. The wings 178 are shown as extending outward from major portions of the card peripheral edge 50.

Figure 11:
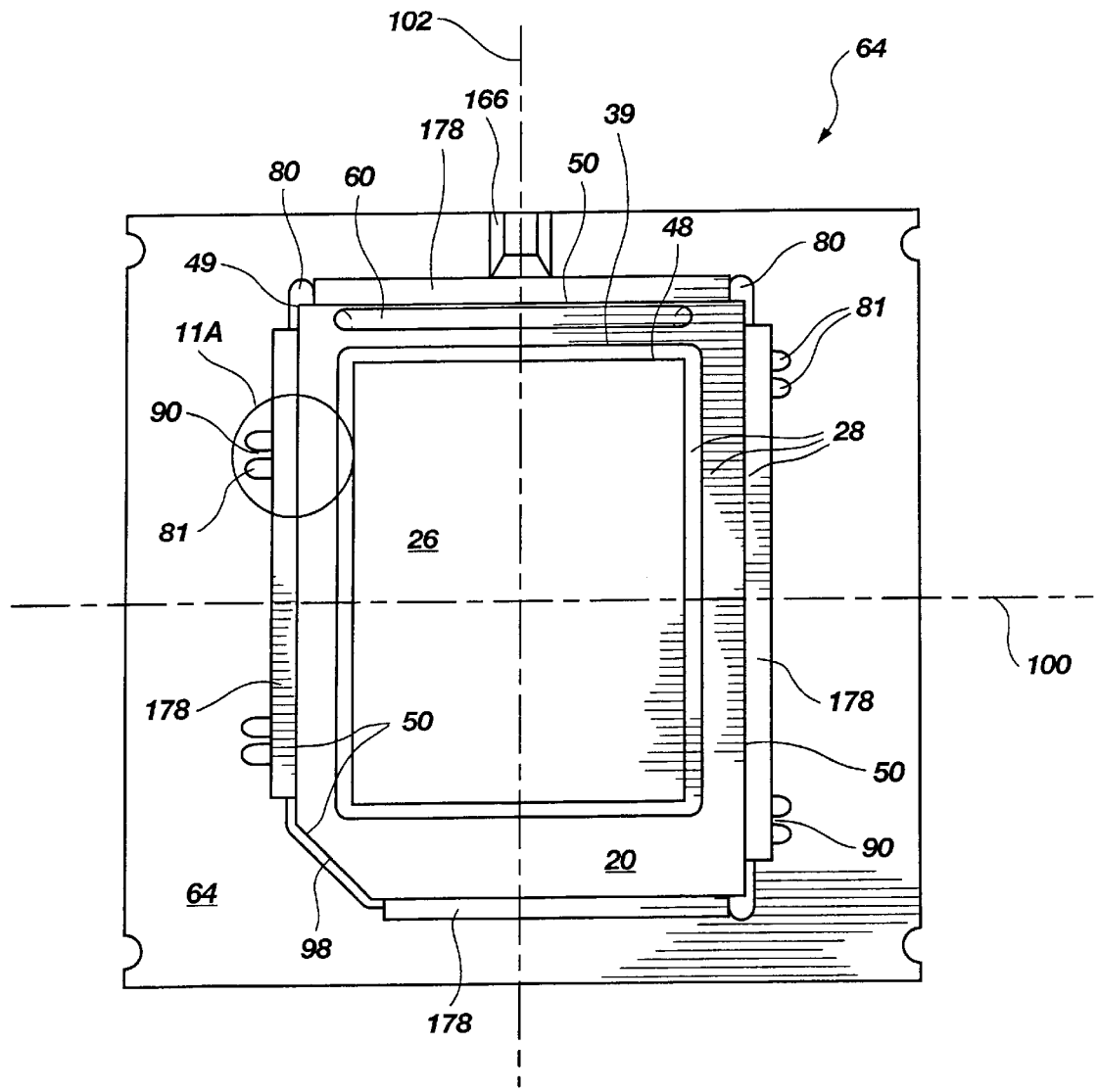
FIG. 11 is an enlarged plan view of a module containing a circuitized substrate following application of a second plastic casting thereon in the fabrication of a semiconductor card in accordance with another embodiment of the invention.
Figure 11A:
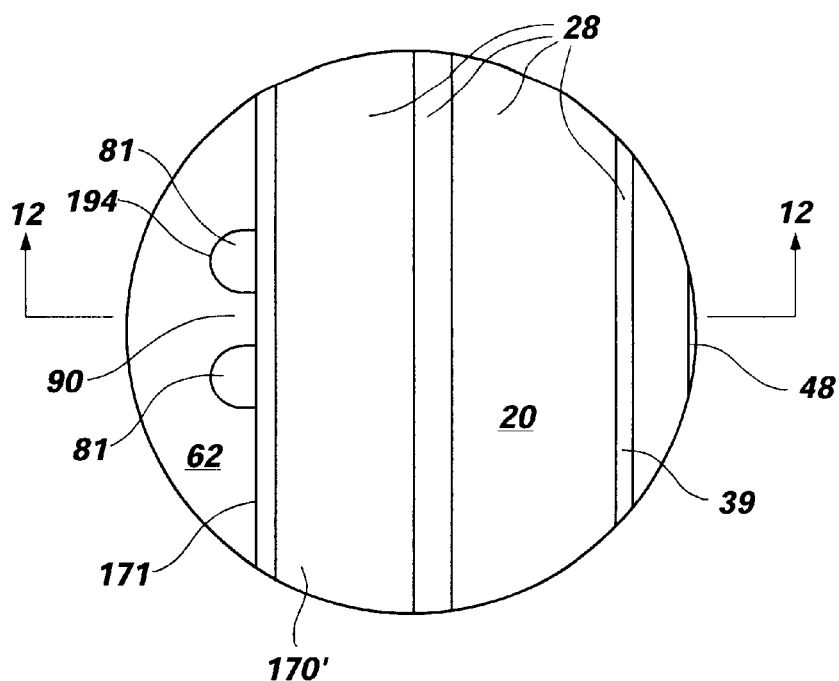
FIG. 11A is an enlarged partial plan view of a portion of a module following application of a second plastic casting thereon, in accordance with region 11A of FIG. 11.
Figure 12:
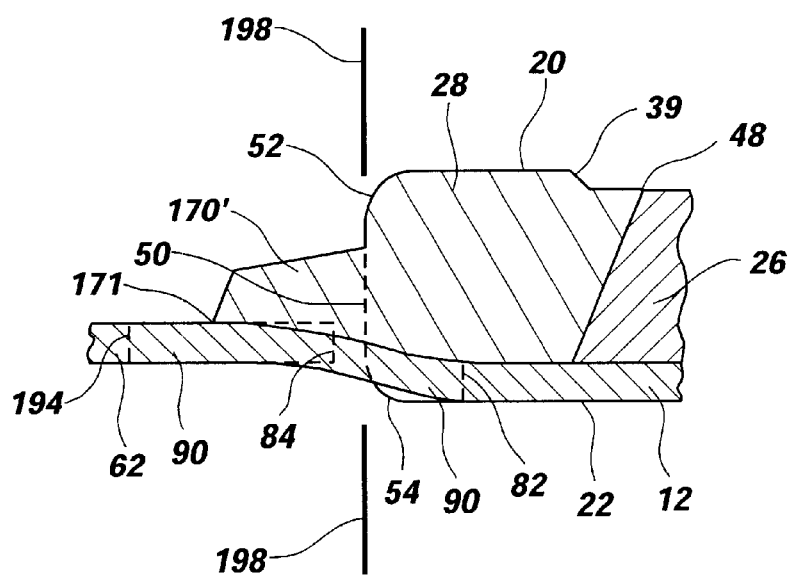
FIG. 12 is an enlarged cross-sectional side view of a portion of a module following application of a second plastic casting thereon, in accordance with section line 12—12 of FIG. 11A.

Depicted in drawing FIGS. 11A and 12 is a small region of the second molded plastic casting 28 adjacent a connecting segment 90. Extensions 81 of the peripheral opening 80, not visible, are shown as extending outwardly beyond the wing edges 171 into the frame 62. Alternatively, wings 170 may cover the extensions 81. The second molded plastic casting 28 abuts the first molded plastic casting 26 along an interface 48. A connecting segment 90 between frame 62 and substrate 12 is bent by positioning the substrate 12 with attached molded plastic castings 26, 28 to a lower level than the frame 62. The connecting segment 90 effectively extends from the tips 194 of the opening extensions 81 to the inner edge 82 of the peripheral opening 80, so that its curvature is gradual. This permits a greater displacement of the substrate 12 without breakage of the connecting segments 90.

As shown in drawing FIG. 12, the second molded plastic casting 28 has rounded junctures 52, 54 of the card peripheral edge 50 with the upper side 20 and lower side 22 of the completed semiconductor card 10.

Following removal of the module 64 from the molding assembly 180, the semiconductor card 10 may be singulated by sawing along each peripheral edge 50, i.e., along plane 198, with a circular saw, for example. Following singulation, the exposed ends of the curved connecting segments 90 along card peripheral edge 50 are seen to be displaced upwardly from the card back side 22. Thus, any burrs resulting from cutting of the connecting segments 90 will be minimized.

Figure 13:
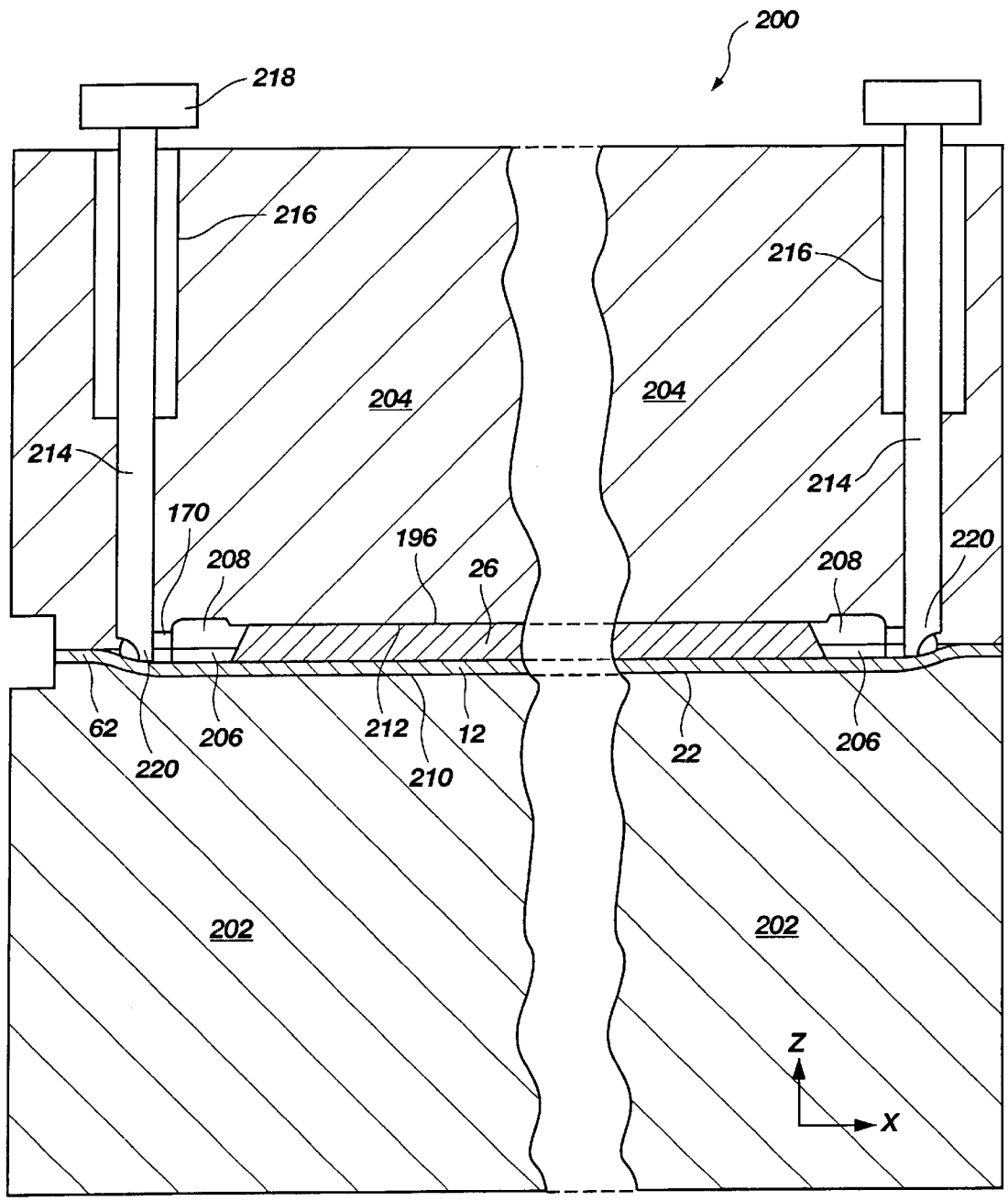
FIG. 13 is a partial enlarged cross-sectional view of a molding assembly configured to mold a second plastic casting on a circuitized substrate having its circuit encapsulated by a first plastic casting, in accordance with a further embodiment of the invention.
Figure 14:
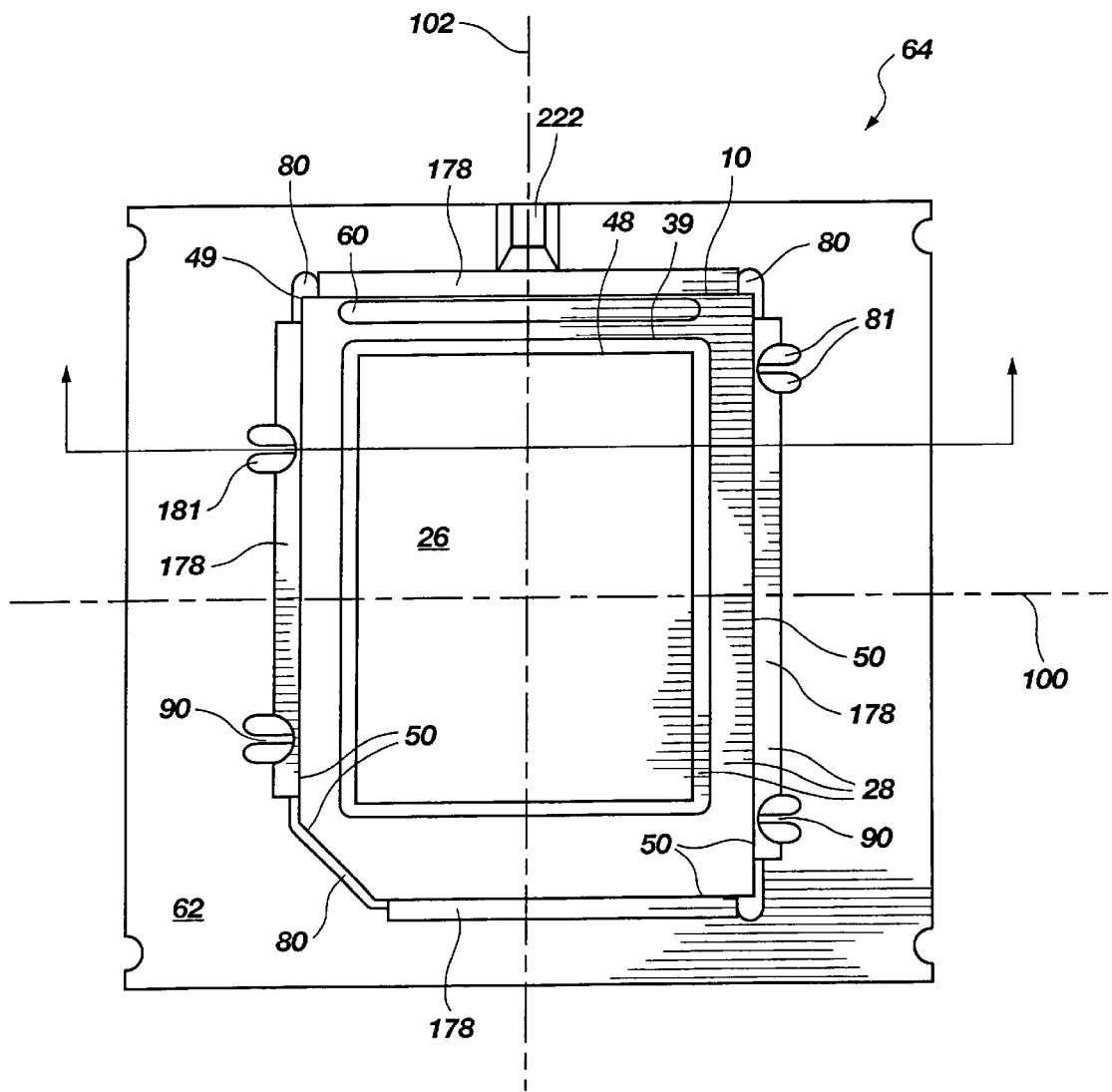
FIG. 14 is an enlarged plan view of a module following application of a second plastic casting thereon in accordance with a further embodiment of the invention.

Another embodiment of the invention is illustrated in drawing FIGS. 13 and 14. The molding assembly 200, such as a transfer mold, has a lower plate 202 with a lower mold cavity 206 having a mold surface 210. An upper plate 204 has an upper mold cavity 208 with a mold surface 212. Like molding assembly 180, the mold cavities 206, 208 are configured for displacement of the substrate 12 downward by pressure of the mold surface 212 of upper mold cavity 208 on the first molded plastic casting 26. Wing portions 170 of the mold cavities 206, 208 form wings 170' along the card peripheral edges 50.

Another feature of the upper plate 204 comprises a plurality of down-set pin through-holes 216, each located above a connecting segment 90. A down-set pin 214 may be inserted in each hole 216 to motivate the connecting segments 90 and attached substrate 12 downward into and against the lower mold surface 210 of lower mold cavity 206. Passage of liquid polymer to the back side 18 of the substrate 12 is thus prevented.

As shown in drawing FIGS. 13 and 14, each down-set hole 216 and pin 214 is positioned immediately over a connecting segment 90, outside of the peripheral edge 50 of the semiconductor card 10. The down-set pin 214 is shown as being generally cylindrical with an outer end 218 and an inner end 220 which may be of reduced size. In the figures, the inner end 220 is shown as having a hemispherical shape with chamfered edges, but any shape which effectively clamps a connecting segment 90 against the lower mold surface 210 may be utilized. For example, the inner end 220 may be square, rectangular, quarter round, lunate, etc. The holes 216 and down-set pins 214 are preferably configured so that the inserted pins are always in the same position relative to the connecting segments 90. As shown herein, the configuration of the molding assembly 200 and the configuration of module 64 must be compatible.

As shown in drawing FIG. 14, the module 64 is removed from the molding assembly 200. The semiconductor card 10 may be singulated from the frame 62 by cutting or sawing through the wings 170' and connecting segments 90 adjacent to the card peripheral edges 50. While ejection pins 132 are not shown in drawing FIG. 13, it is understood that, in most cases, such pins will be used to push the module 64 out of the upper mold cavity 208. A semiconductor card 10 is produced having very little if any flash material and with generally smooth peripheral edges 50.

Irrespective of the type of molding plate configuration which is used, the formation of sequential first and second molded plastic castings 26, 28 on a substrate 12 results in a reduction in fabrication time and effort. Flash material is eliminated or minimized. A smooth, burr-free card peripheral edge 50 may be produced with edges being rounded, drafted, or both. Different polymeric molding compounds (resin) may be used in each molding step to take advantage of particular properties of each compound. For example, one resin 130 may be used for the first (encapsulating) molded plastic casting 26, and a second or different resin 160 may be used for the second molded plastic casting 28, to provide the wear-resistant exterior of the semiconductor card 10.

In the manufacture of the semiconductor card 10 of the invention, the steps involved may be summarized as including:

a. A strip 70 of a dielectric material is provided in sheet form;

b. A peripheral opening 80 is formed in at least one portion of the strip 70 designated as a module 64, in which the opening 80 defines the boundaries of a substrate 12. At least one side of the substrate 12 is connected to a frame 62 of the module 64 by connecting segments 90 of the module 64. Other openings for indexing and handling may also be provided;

c. A circuit 15 is formed on the "circuit" side 16 of the substrate 12, including at least one semiconductor component 14 as well as other component(s) and conductors 17, 104;

d. External contacts 24 are formed on the back side 18 of the substrate 12 and connected to circuit 15;

e. A first set of mold plates 112 and 114 is provided. The mold plates are configured for molding a first polymeric molded (plastic) casting 26 over the circuit 15 to encapsulate it while leaving a peripheral area 122 of the substrate 12 uncovered by resin 130;

f. The module 64 is mounted between the set of mold plates 112 and 114 and a first fluid molding resin 130 is introduced to fill the mold cavity 116 to form the first molded plastic casting 26;

g. After hardening and cooling of the first molded plastic casting 26, the mold plates are opened and the once-molded module 64 removed therefrom;

h. The module 64 is degated to remove plastic which hardened in the feed runner and gate;

i. A second set of mold plates 142 and 144, or 182 and 184, or 202 and 204 is provided. The mold plates are configured for molding a second polymeric molded plastic casting 28 on the substrate 12 about the first molded plastic casting 26 and for enclosing the edges of the substrate 12 in a second plastic;

j. The module 64 from the first molding step is mounted between the second set of mold plates and a second fluid molding resin 160 is introduced to fill the mold cavity to form the second molded plastic casting 28;

k. After hardening and cooling of the second molded plastic casting 28, the mold plates are opened and the twice-molded module 64 is removed therefrom; and l. The twice-molded semiconductor card 10 is singulated from the frame 62 of module 64.

m. If desired, exposed ends 96 of the connecting segments 90 along the card peripheral edge 50 may be cut back. If necessary, flash residue may be removed.

As described herein, the invention provides a semiconductor card by a method which eliminates a separate glob top encapsulation step and ensures smooth card edges which are rounded or oblique. Desired card dimensions are readily maintained, and flash material requiring removal is minimized or avoided. If desired, the molding assembly may be configured to form several cards simultaneously.

Thus, the invention provides an improved semiconductor card and a method of fabricating the card. While the invention has been described with reference to certain illustrated embodiments, as will be apparent to those skilled in the art, numerous changes and modifications can be made without departing from the spirit and scope of the invention as defined by the following claims.

What is claimed is:

1. A semiconductor card comprising:
 a printed circuit substrate comprising:
  a circuit side having a peripheral portion;
  a back side having a peripheral portion;
  a peripheral substrate edge joining said back side to said circuit side;
  a plurality of conductors on said circuit side;
  a plurality of external contacts on said back side in electrical communication with said plurality of conductors;
  at least one semiconductor component on said circuit side in electrical communication with said plurality of conductors;
  a first plastic casting molded to said circuit side to encapsulate said at least one semiconductor component and leave said external contacts and said peripheral portion of said circuit side uncovered;
  a second plastic casting molded to said peripheral portion of said circuit side and extending laterally outwardly therefrom to form a periphery of said semiconductor card; and
  at least one connecting segment exposed at said semiconductor card periphery.

2. The semiconductor card of claim 1, wherein a portion of said at least one connecting segment is exposed in an intermediate region of said semiconductor card periphery.

3. The semiconductor card of claim 2, further comprising a notch in said semiconductor card periphery to recess said portion of said exposed at least one connecting segment to a non-protruding position.

4. The semiconductor card of claim 3, wherein said notch comprises four notches.

5. The semiconductor card of claim 1, wherein said second plastic casting abuts said first plastic casting along an interface thereof.

6. The semiconductor card of claim 5, wherein an abutting portion of said second plastic casting is coplanar with said first plastic casting.

7. The semiconductor card of claim 5, further comprising a label attached to said first plastic casting.

8. The semiconductor card of claim 7, wherein said label covers said interface between said first and said second plastic castings.

9. The semiconductor card of claim 1, wherein said first and said second plastic castings comprise epoxy resin.

10. The semiconductor card of claim 1, wherein said first and said second plastic castings comprise different resins.

11. The semiconductor card of claim 1, wherein at least one of said first and said second plastic castings comprises a Novolac epoxy resin.

12. The semiconductor card of claim 1, wherein said substrate comprises a reinforced organic polymer resin.

13. The semiconductor card of claim 1, wherein said back side of said substrate is substantially exposed.

14. The semiconductor card of claim 1, wherein said semiconductor card has a thickness of about 1 mm to about 6 mm.

15. The semiconductor card of claim 1, wherein said substrate has a thickness of about 0.2 to about 1.6 mm.

16. The semiconductor card of claim 1, wherein said at least one semiconductor component comprises digital memory.

17. The semiconductor card of claim 1, wherein said semiconductor card comprises a memory card for digitally recording and retrievably storing photographic data in a digital camera.

18. A card comprising:
a printed circuit substrate including:
a circuit side having a peripheral portion;
a back side having a peripheral portion;
a peripheral substrate edge joining said back side to said circuit side;
a plurality of conductors on said circuit side;
a plurality of external contacts on said back side in electrical communication with said plurality of conductors;
at least one semiconductor component on said circuit side in electrical communication with said plurality of conductors;
a first plastic molded to said circuit side to encapsulate said at least one semiconductor component and leave said external contacts and said peripheral portion of said circuit side uncovered;
a second plastic molded to said peripheral portion of said circuit side and extending laterally outwardly therefrom to form a periphery of said card; and
at least one connecting segment exposed at said card periphery.

19. The card of claim 18, wherein a portion of said at least one connecting segment is exposed in an intermediate region of said card periphery.

20. The card of claim 19, further comprising a notch in said card periphery to recess said portion of said exposed at least one connecting segment to a non-protruding position.

21. The card of claim 20, wherein said notch comprises four notches.

22. The card of claim 18, wherein said second plastic abuts said first plastic along an interface thereof.

23. The card of claim 22, wherein an abutting portion of said second plastic is substantially coplanar with said first plastic.

24. The card of claim 22, further comprising a label attached to said first plastic.

25. The card of claim 24, wherein said label covers said interface between said first plastic and said second plastic.

26. The card of claim 18, wherein said first plastic and said second plastic comprise epoxy resin.

27. The card of claim 18, wherein said first plastic and said second plastic comprise different resins.

28. The card of claim 18, wherein at least one of said first plastic and said second plastic comprises a Novolac epoxy resin.

29. The card of claim 18, wherein said substrate comprises a reinforced organic polymer resin.

30. The card of claim 18, wherein said back side of said substrate is substantially exposed.

31. The card of claim 18, wherein said card has a thickness of about 1 mm to about 6 mm.

32. The card of claim 18, wherein said substrate has a thickness of about 0.2 to about 1.6 mm.

33. The card of claim 18, wherein said at least one semiconductor component comprises digital memory.

34. The card of claim 18, wherein said card comprises a memory card for digitally recording and retrievably storing photographic data in a digital camera.

* * * * *

UNITED STATES PATENT AND TRADEMARK OFFICE
CERTIFICATE OF CORRECTION

PATENT NO. : 6,538,311 B2
DATED : March 25, 2003
INVENTOR(S) : Todd O. Bolken

It is certified that error appears in the above-identified patent and that said Letters Patent is hereby corrected as shown below:

Drawings,
FIGURE 6, insert a lead line extending from "61" to generally indicate the location of the noninsertable end 61. (as shown below)

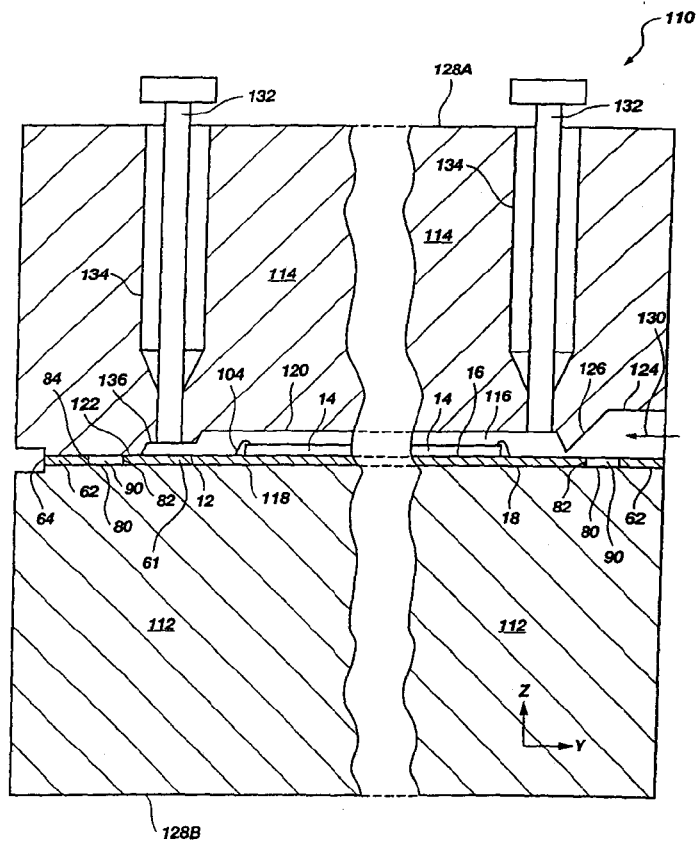

Fig. 6

UNITED STATES PATENT AND TRADEMARK OFFICE
CERTIFICATE OF CORRECTION

PATENT NO. : 6,538,311 B2
DATED : March 25, 2003
INVENTOR(S) : Todd O. Bolken

It is certified that error appears in the above-identified patent and that said Letters Patent is hereby corrected as shown below:

Drawings (cont'd),
FIGURE 11, change the lower left occurrence of "64" to -- 62 -- and change all occurrences of "178" to -- 170' -- (as shown below)

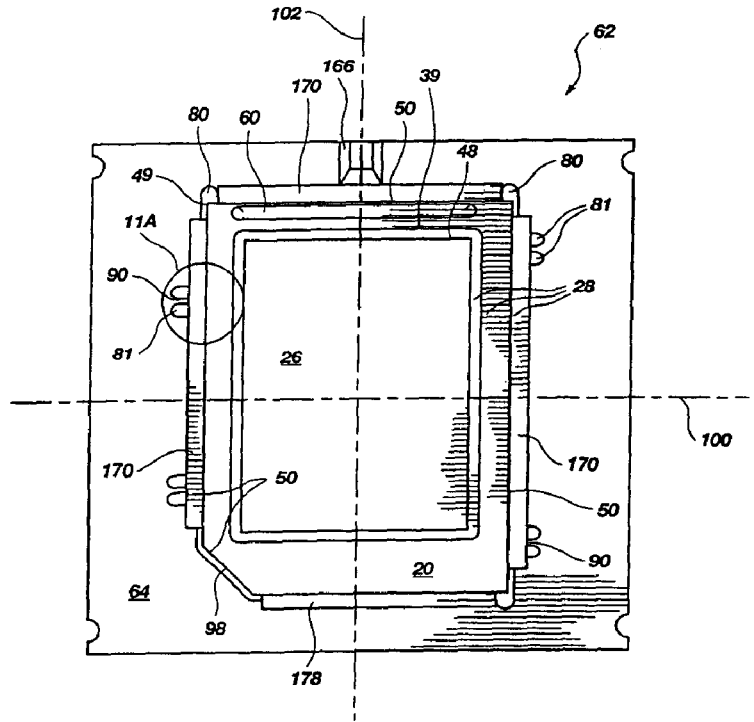

Fig. 11

UNITED STATES PATENT AND TRADEMARK OFFICE
CERTIFICATE OF CORRECTION

PATENT NO.     : 6,538,311 B2
DATED          : March 25, 2003
INVENTOR(S)    : Todd O. Bolken It is certified that error appears in the above-identified patent and that said Letters Patent is hereby corrected as shown below:

Drawings (cont'd),
FIGURE 14, change "181" to -- 81 -- and change all occurrences of "178" to -- 170' -- (as shown below)

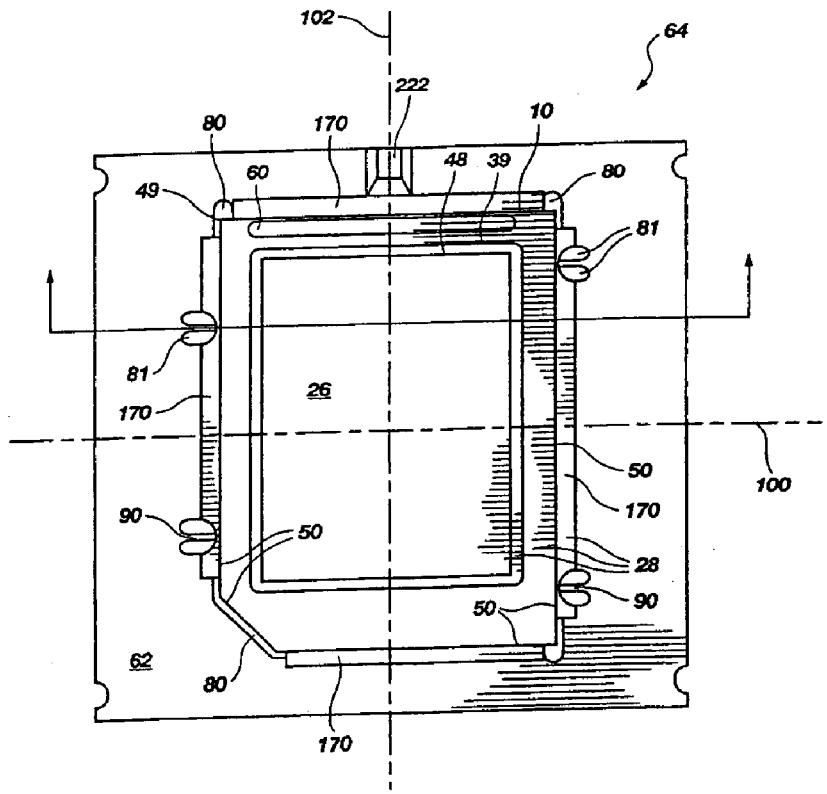

Fig. 14

UNITED STATES PATENT AND TRADEMARK OFFICE
CERTIFICATE OF CORRECTION

PATENT NO. : 6,538,311 B2
DATED : March 25, 2003
INVENTOR(S) : Todd O. Bolken

It is certified that error appears in the above-identified patent and that said Letters Patent is hereby corrected as shown below:

Column 3,
Line 55, after "Z-axis," and before "taken" insert -- as --

Column 6,
Line 24, after "width" delete "66"

Column 8,
Line 4, change "bottom 128B" with -- top 128A --

Column 10,
Line 21, change "178" to -- 170' --
Line 28, change "170" to -- 170' --
Line 61, change "170' " to -- 170' --

Column 11,
Line 24, change "170' " to -- 170' --

Signed and Sealed this

Thirtieth Day of September, 2003

JAMES E. ROGAN
*Director of the United States Patent and Trademark Office*